United States Patent
Pingle et al.

(10) Patent No.: US 10,436,838 B2
(45) Date of Patent: Oct. 8, 2019

(54) AUTOMATED SEMICONDUCTOR PLATFORM TESTING

(71) Applicant: Intel Corporation, Santa Clara, CA (US)

(72) Inventors: Sneha S. Pingle, Bangalore (IN); Soumya P. Mukherjee, Bangalore (IN); Chandrashekhar Mutuguppe Venkataramana, Banglore (IN); Divya Appaji Lalithamba, Banglore (IN)

(73) Assignee: Intel Corporation, Santa Clara, CA (US)

( * ) Notice: Subject to any disclaimer, the term of this patent is extended or adjusted under 35 U.S.C. 154(b) by 85 days.

(21) Appl. No.: 15/467,532

(22) Filed: Mar. 23, 2017

(65) Prior Publication Data

US 2018/0277235 A1 Sep. 27, 2018

(51) Int. Cl.
  *G01R 31/3183* (2006.01)
  *G11C 29/38* (2006.01)
  *G11C 29/36* (2006.01)
  *G06N 20/00* (2019.01)
  *G11C 29/56* (2006.01)

(52) U.S. Cl.
  CPC ..... *G01R 31/318371* (2013.01); *G06N 20/00* (2019.01); *G11C 29/36* (2013.01); *G11C 29/38* (2013.01); *G11C 29/56* (2013.01)

(58) Field of Classification Search
  CPC ...... G01R 31/31912; G01R 31/318307; G01R 31/31707; G01R 31/31813; G01R 31/31917; G01R 31/318371; G06F 11/263
  See application file for complete search history.

(56) References Cited

U.S. PATENT DOCUMENTS

| | | | | |
|---|---|---|---|---|
| 5,530,887 A * | 6/1996 | Harper | ................. | G06F 9/4411 710/104 |
| 6,622,271 B1 * | 9/2003 | Colby | ............. | G01R 31/31707 714/724 |
| 6,681,351 B1 * | 1/2004 | Kittross | ......... | G01R 31/318307 702/119 |
| 7,721,265 B1 * | 5/2010 | Xu | ....................... | G06F 11/3664 714/31 |
| 2003/0149949 A1 * | 8/2003 | Price | ............. | G01R 31/318314 716/106 |

(Continued)

*Primary Examiner* — Steve N Nguyen
(74) *Attorney, Agent, or Firm* — Grossman, Tucker, Perreault & Pfleger, PLLC

(57) ABSTRACT

The present disclosure is directed to systems and methods for autonomously generating test methods for testing features included on semiconductor platforms. The systems and methods described herein either manually or autonomously receive information and/or data indicative of the features included in, on, or about a semiconductor platform to be tested. Based on the presence of features and/or feature combinations on the semiconductor platform, the systems and methods described herein autonomously select the appropriate test blocks used to generate the test method. The systems and methods described herein generate additional test methods as permutations of the selected test blocks. The validity of each test method is confirmed using dependency rules and all valid test methods are combined to form a test package that is used to test the semiconductor platform.

20 Claims, 8 Drawing Sheets

(56) References Cited

U.S. PATENT DOCUMENTS

| | | | | |
|---|---|---|---|---|
| 2003/0212938 A1* | 11/2003 | Sutton | ............ | G01R 31/318307 |
| | | | | 714/724 |
| 2004/0181763 A1* | 9/2004 | Soltis, Jr. | ....... | G01R 31/318307 |
| | | | | 716/111 |
| 2005/0149790 A1* | 7/2005 | Yoshida | ........... | G01R 31/31704 |
| | | | | 714/724 |
| 2007/0233629 A1* | 10/2007 | Balog | ............ | G01R 31/318314 |
| | | | | 706/47 |
| 2014/0257736 A1* | 9/2014 | Atherton | ............... | G06F 11/263 |
| | | | | 702/108 |

* cited by examiner

AUTOMATED SEMICONDUCTOR PLATFORM TESTING

TECHNICAL FIELD

The present disclosure relates to technologies for testing semiconductor platforms.

BACKGROUND

A semiconductor platform incorporates a number of features that impart functionality to the platform. Some features are independent of other platform features (i.e., do not depend on the presence of other platform features) while other features are dependent upon the presence of other platform features. During development, some or all of these features must be tested to minimize or eliminate the presence of bugs and similar defects. Such defects may be inherent in the platform design or may occur as a consequence of actions taken by the end user. Consequently, "bug testing" is generally comprehensive and includes detecting bugs in both design and operation.

Semiconductor platform testing involves generating test cases that are executed by the platform and monitored using a host device. Any detected errors on the semiconductor platform are reported to the host device performing the test on the semiconductor platform. Typically, test cases are generated in prose format. Each prose format test case is then converted to machine-executable code. The machine-executable code is then provided to the semiconductor platform for execution.

However, with the increasing complexity of modern integrated circuit design, such testing grows ever more complex. Additionally, the growing demand for multipurpose processors increases the number of use cases for each semiconductor platform and further increases the number of test cases to ensure overall system reliability and robustness for the end user. The large number of test cases required to comprehensively test such complex, multi-use, semiconductor platforms often exceeds available resources.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
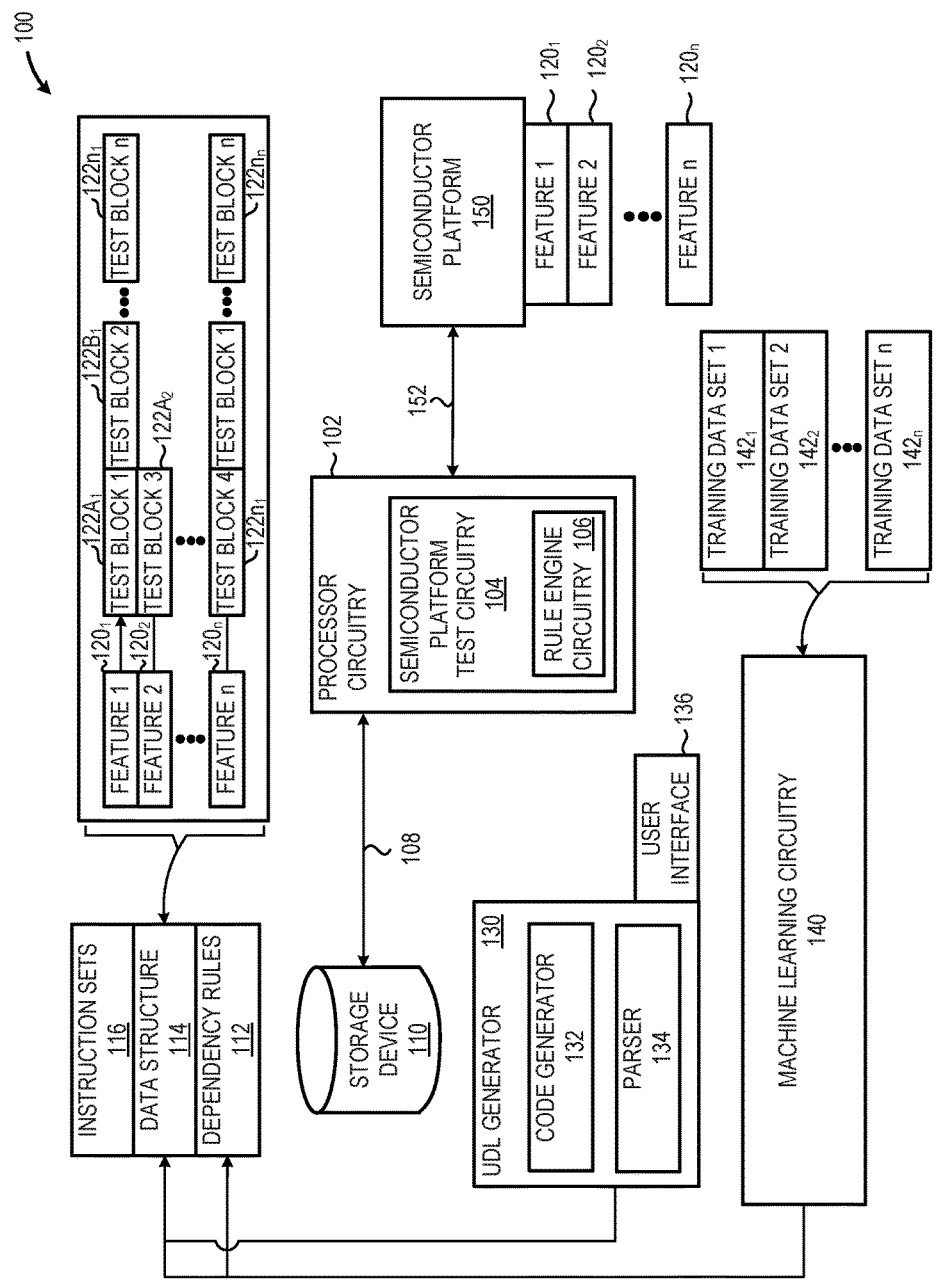
FIG. 1 depicts an example semiconductor platform test system that includes processor circuitry at least a portion of which provides the semiconductor platform test circuitry and the test rule engine circuitry, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems, methods, and apparatuses disclosed herein use semiconductor platform test circuitry to autonomously generate test packages that include a number of test methods for testing semiconductor platform features. Each test method is formed using a number of test blocks. The test blocks may be generated manually using a user defined language (UDL) having a defined syntax and parameter structure. Optionally, the test blocks may be generated using machine learning circuitry that may be trained using historical test methods. The semiconductor platform features and each of the test blocks logically associated therewith are stored or otherwise retained in a data structure disposed in a communicably coupled storage device.

In operation, the semiconductor platform test circuitry receives information and/or data associated with features and/or feature combinations included on a semiconductor platform to be tested. For each feature or feature combination, the semiconductor platform test circuitry selects the logically associated test blocks and generates a test package that includes a plurality of test methods. Each of the test methods included in the test package is generated as a permutation of the test blocks logically associated with the respective feature or feature combination.

The semiconductor platform test circuitry also includes test rule engine circuitry to determine the validity of each test method included in a test package. The test rule engine circuitry, using dependency rules stored or otherwise retained in, on, or about the communicably coupled storage device, assesses each test method to determine whether the test blocks fulfill conditions precedent, conditions subsequent, and/or test block compatibility. The test rule engine circuitry also detects and discards duplicate test methods. The resultant test package thus includes only those test methods that have been validated and determined to be non-duplicative by the test rule engine circuitry.

The systems and methods described herein beneficially and advantageously improve the consistency and reproducibility of testing of semiconductor platform features. Automating the generation of test methods reduces the human and financial resources dedicated to authoring and coding of the test methods, enabling greater test method diversity. Increasing the diversity of test methods applied to a semiconductor platform feature beneficially and advantageously improves the reliability and robustness of the resultant semiconductor platform. The use of the test rule engine circuitry minimizes or even prevents the execution of logically flawed test methods.

A semiconductor platform test method is provided. The method may include: generating a plurality of test blocks, each of the plurality of test blocks logically associated with assessing an operability parameter of at least one semiconductor platform feature; forming a logical association between each of the plurality of test blocks and each of at least one respective semiconductor platform feature; identifying, by semiconductor platform test circuitry, each of a number of features included in a semiconductor platform; for each respective identified feature included in the semiconductor platform: retrieving, by the semiconductor platform test circuitry, one or more test blocks logically associated with the respective feature from the plurality of test blocks; generating, by the semiconductor platform test circuitry, a plurality of test methods, each of the plurality of test methods including a respective permutation of the one or more retrieved test blocks; and validating, by the semiconductor platform test circuitry, each of the plurality of test methods; and performing, by the semiconductor platform test circuitry, each of the plurality of test methods on the semiconductor platform.

A semiconductor platform test system is provided. The system may include: at least one communications interface to exchange data with a communicably coupled semiconductor platform; processor circuitry communicably coupled to the communications interface; at least one storage device communicably coupled to the processor circuitry, the at least one storage device including instructions, that when executed by the processor circuitry, transform the processor circuitry to semiconductor test platform circuitry, the semiconductor test platform circuitry to: identify each of a number of features present in a semiconductor platform, for each respective identified feature present in the semiconductor platform: retrieve one or more test blocks logically associated with the respective feature from a plurality of test blocks; generate a plurality of test methods, each of the plurality of test methods including a respective permutation of the one or more retrieved test blocks; and validate each of the plurality of test methods; and perform each of the plurality of test methods on the semiconductor platform.

Another semiconductor platform test system is provided. The system may include: a means for generating a plurality of test blocks, each of the plurality of test blocks logically associated with assessing an operability parameter of at least one semiconductor platform feature; a means for forming a logical association between each of the plurality of test blocks and each of at least one respective semiconductor platform feature; a means for identifying each of a number of features present in a semiconductor platform; for each respective identified feature present in the semiconductor platform: a means for retrieving one or more test blocks logically associated with the respective feature from the plurality of test blocks; a means for generating a plurality of test methods, each of the plurality of test methods including a respective permutation of the one or more retrieved test blocks; and a means for validating each of the plurality of test methods; and a means for performing each of the plurality of test methods on the semiconductor platform.

A non-transitory processor-readable storage device is provided. The non-transitory processor-readable storage device including instructions, that when executed by the processor circuitry, transform the processor circuitry to semiconductor test platform circuitry, the semiconductor test platform circuitry to: identify each of a number of features present in a semiconductor platform; for each respective identified feature present in the semiconductor platform: retrieve one or more test blocks logically associated with the respective feature from a plurality of test blocks; generate a plurality of test methods, each of the plurality of test methods including a respective permutation of the one or more retrieved test blocks; and validate each of the plurality of test methods; and perform each of the plurality of test methods on the semiconductor platform.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 depicts an example semiconductor platform test system 100 that includes processor circuitry 102 at least a portion of which provides the semiconductor platform test circuitry 104 and the test rule engine circuitry 106, in accordance with at least one embodiment described herein. A storage device 110 communicably couples to the processor circuitry 102. The storage device includes one or more storage elements, devices, or similar that may be disposed local to (i.e., collocated with) or remote from (i.e., network connected to) the processor circuitry 102. One or more dependency rules 112, data structures 114, and/or instruction sets 116 may be stored or otherwise retained by the storage device 110. The system 100 also includes a user defined language (UDL) generator 130 communicably coupled to the storage device 110. In some implementations, the processor circuitry 102 may provide all or a portion of the UDL generator 130. The system 100 may optionally include machine learning circuitry 140. A semiconductor platform 150 may be tested by communicably coupling 152 the semiconductor platform 150 to the processor circuitry 102.

The storage device 110 includes one or more data structures 114 that includes information and/or data indicative of one or more test blocks 122A-122n (collectively, "test blocks 122") logically associated with each of a number of features $120_1$-$120_n$ (collectively, "features 120" or "semiconductor platform features 120") included on a semiconductor platform 150. In embodiments, information and/or data indicative of the features 120 included in a semiconductor platform 150 to be tested is provided to the test rule engine circuitry 106. In some implementations, the information and/or data indicative of the features 120 included in a semiconductor platform 150 may be provided by the system user. In some implementations, the semiconductor platform test circuitry 104 may autonomously detect the features 120 included in a semiconductor platform 150. Such autonomous detection may be performed, for example, by reading a two-dimensional or three-dimensional code included on the semiconductor platform 150 or by reading a SKU or part number on the semiconductor platform 150.

In some implementations, the test rule engine circuitry 106 may determine whether dependencies exist between the features 120 included in the semiconductor platform 150. Such dependences may alter or adjust the test methods applied by the semiconductor platform test circuitry 104 to the semiconductor platform 150. For example, the semiconductor platform test circuitry 104 may determine that feature "A" is included on the semiconductor platform 150 and feature "A" has no dependency on other features and thus may be individually tested. In another example, the semiconductor platform test circuitry 104 may determine that features "B" and "C" are included on the semiconductor platform 150 and feature "C" is dependent upon feature "B" (i.e., feature "C" is incapable of independent implementation on semiconductor platform 150), thus the semiconductor platform test circuitry 104 may test features "B" and "C" as a group.

The semiconductor platform test circuitry 104 beneficially and advantageously creates a large number of test methods for testing the semiconductor platform 150. Each test method may be generated by the semiconductor platform test circuitry 104 and may include serial and/or parallel sequences that include of a plurality of test blocks 122. The semiconductor platform test circuitry 104 is able to quickly generate a large number of test methods by reordering or resequencing the test blocks 122 included in a particular test method (i.e., by generating a large number of different test block orderings or permutations). For example, if semiconductor platform 150 includes feature "A" and a test method logically associated with feature "A" by the test rule engine circuitry 106 includes "n" test blocks $122_1$-$122_n$, a total of "n!" (n factorial) possible test block permutations exist. Thus, where a test method including five (5) test blocks $122_1$-$122_n$ is logically associated with feature "A," a total of 120 (5!) possible test method permutations exist. Since each of these scenarios is autonomously created by the semiconductor platform test circuitry 104 using standard test blocks 122, test method consistency and reproducibility is increased over manually coded test methods where the same coders may not work on each test method or where test methods may be eliminated based on human or financial resource limitations.

The test rule engine circuitry 106 validates each test block permutation by comparing the test block arrangement in the respective test method against dependency rules 112. Test methods detected by the test rule engine circuitry 106 as violating one or more dependency rules 112, such as by having unsatisfied conditions precedent or conditions subsequent may be discarded. Similarly test methods determined by the test rule engine circuitry 106 duplicative may be discarded. Thus, the system 100 improves the reliability and robustness of the semiconductor platform 150 by executing a considerably greater number of test methods than if the test methods were individually generated and executed. The ability for the semiconductor platform test circuitry 106 to generate test methods without regard to the likelihood of occurrence provides coverage for unusual scenarios such as corner cases and negative scenarios—both of which may be passed over as "not worth testing" or "not cost effective to test" if each test method were manually coded.

The system 100 includes a UDL generator 130 that permits a system user to enter a test block via a user interface 136. In embodiments, a system user may enter a test step in a natural language (e.g., "plain English") format via user interface 136. In some implementations, the user entered test step may additionally or alternatively include one or more test and/or operational parameters and/or parameter ranges also entered via user interface 136. A parser 134 included with the UDL generator 130 may parse the natural language test step into an intermediate format amenable to automated code development. A code generator 132 included with the UDL generator 130 may autonomously generate a test block 122 corresponding to the originally entered test step. The code generator 132 autonomously generates the test block 122 as machine-executable code that may be associated with a particular semiconductor platform feature 120 and stored in one or more data structures 114. The use of the UDL generator 130 beneficially and advantageously maintains consistency in feature testing across a variety of semiconductor platforms 150.

The processor circuitry 102 includes electrical components, semiconductor devices, logic elements, and/or combinations thereof. In embodiments, some or all of the electrical components, semiconductor devices, and/or logic elements may be configurable such that at least a portion of the processor circuitry 102 may be permanently or selectively transformed to provide the semiconductor platform test circuitry 104. In embodiments, some or all of the electrical components, semiconductor devices, and/or logic elements may be configurable such that at least a portion of the processor circuitry 102 may be permanently or selectively transformed to provide the test rule engine circuitry 106. The processor circuitry 102 may include one or more single- or multi-core processors, microprocessors, controllers, or similar devices capable of executing instruction sets.

One or more communications links 108 communicably couples the processor circuitry 102 to the storage device 110. In embodiments, the communications link 108 may include one or more buses or similar conductive pathways communicably coupling the processor circuitry 102 to one or more local storage devices 110 situated or disposed proximate the processor circuitry 102. In some embodiments, the communications link 108 may include one or more wireless or network connections communicably coupling the processor circuitry 102 to one or more remote storage devices 110, such as one or more server-based or network attached storage devices 110.

The storage device 110 includes non-transitory storage media capable of storing or otherwise retaining information and/or data related to dependency rules 112, one or more data structures 114, one or more instruction sets 116, or combinations thereof. In implementations, the dependency rules 112 may be generated and/or stored in any format. For example, in embodiments, the information and/or data representative of platform feature dependency rules 112 may be stored in, on, or about the storage device 110 as a directed graph or similar. Such platform feature dependency rules 112 may, for example, include information and/or data indicative of condition precedent and/or condition subsequent requirements for semiconductor platform features 120. Such platform feature dependency rules 112 may, for example, include information and/or data representative of incompatible semiconductor platform features 112 (e.g., feature "A" is incompatible with feature "B").

The information and/or data representative of test block dependency rules 112 is stored in, on, or about the storage device 110 as a directed graph or similar. For example, in embodiments, the information and/or data representative of platform feature dependency rules 112 may be stored in, on, or about the storage device 110 as a directed graph. Such platform feature dependency rules 112 may, for example, include information and/or data indicative of condition precedent and/or condition subsequent requirements for semiconductor platform features 120. Such platform feature dependency rules 112 may, for example, include information and/or data representative of incompatible semiconductor platform features 112 (e.g., feature "A" is incompatible with feature "B").

The information and/or data representative of the logical associations between each respective semiconductor platform feature 120 and one or more test blocks 122 is stored or otherwise retained as a database, relational database, or similar logical structure disposed in, on, or about the storage device 110. For example, as depicted in FIG. 1, feature $120_1$ is logically associated with test blocks $122A_1$, $122B_1$, ... $122n_1$. Thus, the presence of feature $120_1$ on a semiconductor platform 150 would result in at least a test method including a various combinations and/or permutations of test blocks $122A_1$, $122B_1$, ... $122n_1$. In some implementations, a single feature 120 may have more than one set of logical associations. Such may occur, for example, where more than one test method may be applied to a single feature 120. For example, feature 1202 may have a first test method that includes permutations of test blocks $122A_2$, $122B_2$, and $122C_2$ (i.e., 6 possible test methods included in the first test method); a second test method that includes permutations of test blocks $122B_2$, $122C_2$, and $122D_2$ (i.e., 6 possible test methods included in the second test method); and a third test method that includes permutations of test blocks $122G_2$ and $122H_2$ (i.e., 2 possible test methods included in the third test method).

Machine-readable and/or processor-executable instruction sets 116 are stored or otherwise retained in, on, or about the storage device 110. Such machine-readable instruction sets 116 may include any number of instruction sets that transform at least a portion of the processor circuitry 102 to the dedicated and particular semiconductor platform test circuitry 104. Such machine-readable instruction sets 116 may include any number of instruction sets that transform at least a portion of the processor circuitry 120 to the dedicated and particular rule engine circuitry 106.

The system 100 may include or may be communicably coupled to machine-learning circuitry 140. In some implementations, at least a portion of the processor circuitry 102 may provide all or a portion of the machine learning circuitry 140. The machine learning circuitry 140 may use one or more machine learning techniques (neural network, Bayesian statistics, decision tree, linear classification, random forests, etc.) in conjunction with any number of training data sets $142_1$ ... $142_n$ (collectively, "training data sets 142") to extract test blocks 122, test block 122 dependencies, semiconductor platform feature 120/test block 122 logical associations, and similar information and/or data from the number of training data sets 142. In implementations using machine learning circuitry 140, the training data sets 142 may include historical and/or manually coded test methods used to test prior semiconductor platform features 120.

The semiconductor platform 150 may include any number and or type of features $122_1$ ... $120_n$. Such features 120 may include software features, firmware features, hardware features, or combinations thereof. The semiconductor platform 150 may include, but is not limited to, a processor, a microprocessor, a controller, a microcontroller, an application specific integrated circuit (ASIC), a reduced instruction set computer (RISC), a programmable gate array, a system-on-a-chip (SoC), or combinations thereof. During testing, the semiconductor platform test circuitry 104 causes the serial or parallel execution of one or more test methods on the semiconductor platform 150. In embodiments, the semiconductor platform test circuitry 104 compares the results returned from the semiconductor platform 150 during and/or at the conclusion of testing with acceptable results. The semiconductor platform test circuitry 104 may provide the test results and/or the comparison results to a system operator or user via one or more user interfaces, such as a display device or hardcopy output device.

Figure 2:
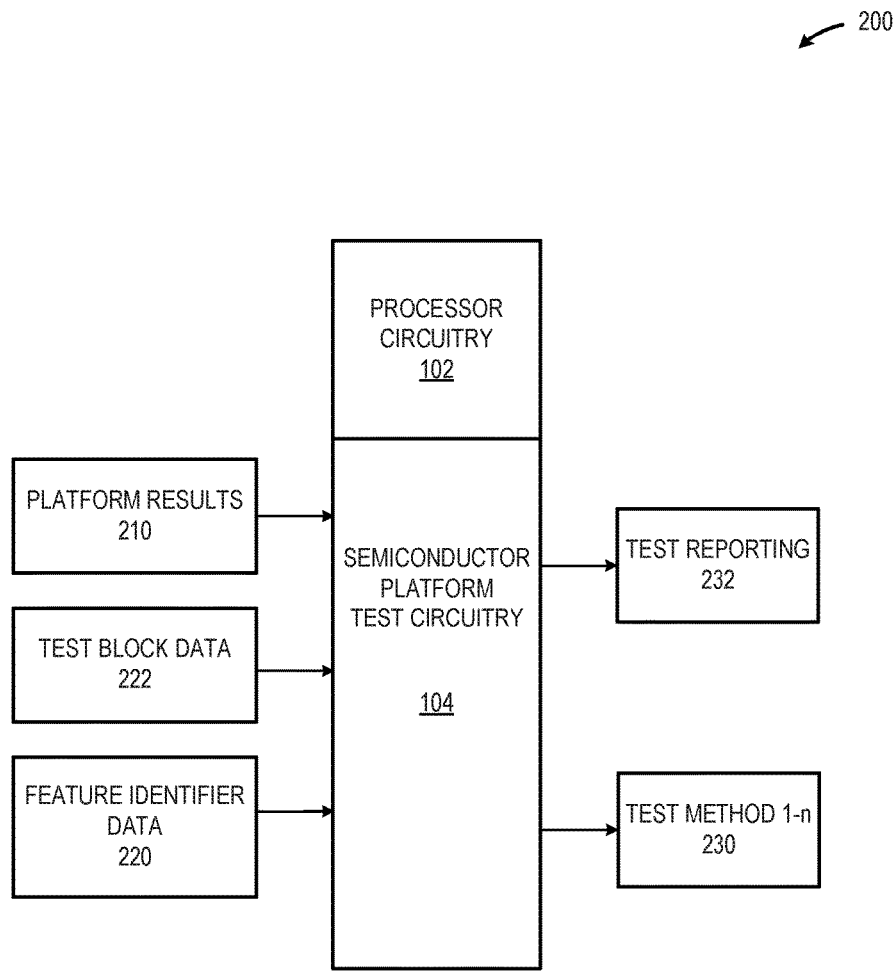
FIG. 2 is an input/output (I/O) diagram depicting a number of example inputs and a number of example outputs of illustrative semiconductor platform test circuitry implemented by processor circuitry, in accordance with at least one embodiment described herein.

FIG. 2 is an input/output (I/O) diagram 200 depicting a number of example inputs and a number of example outputs of illustrative semiconductor platform test circuitry 104 implemented by processor circuitry 102, in accordance with at least one embodiment described herein. As depicted in FIG. 2, the semiconductor platform test circuitry 104 receives a number of inputs that include, but are not limited to: information and/or data 220 associated with semiconductor platform features 120; information and/or data 222 associated with test blocks 122; and, information and/or data associated with test results obtained from the features 120 semiconductor platform 150 under test. The semiconductor platform test circuitry 104 also generates a number of outputs that include, but not limited to: information and/or data associated with validated and non-duplicative test methods formed by sequencing test blocks 120 based on semiconductor platform features 120 and results reporting based on testing performed on semiconductor platform features 120.

In embodiments, all or a portion of the information and/or data 220 associated with semiconductor platform features 120 may be manually collected. For example, a system user may enter the information and/or data associated with one or more semiconductor platform features 120 via a user interface or similar. In other embodiments, all or a portion of the information and/or data associated semiconductor platform features 120 may be autonomously collected by the semiconductor platform test circuitry 104. For example, the semiconductor platform test circuitry 104 may receive information and/or data collected using one or more communicably coupled sensors, such as one or more 2-D or 3-D code readers that scan or otherwise obtain information from one or more 2-D or 3-D codes disposed on or associated with the semiconductor platform 150. In another example, the semiconductor platform test circuitry 104 may use information and/or data accessed based on a serial number, part number, SKU, or similar identifier disposed on or associated with the semiconductor platform 150.

In embodiments, all or a portion of the information and/or data 222 associated with test blocks 122 may be manually entered by a system user via the UDL generator 130. In other embodiments, the semiconductor platform test circuitry 104 may autonomously collect, gather, or extract all or a portion of the information and/or data 222 associated with test blocks 122 using machine learning circuitry 140.

The semiconductor platform test circuitry 104 includes logic to select and assemble test blocks 122 to provide or otherwise generate information and/or data representative of one or more test methods 230. In embodiments, the semiconductor platform test circuitry 104 may select, arrange, organize, or otherwise combine test blocks 122 to provide or otherwise generate information and/or data representative of one or more test methods 230 based on the received information and/or data 220 indicative of the features 120 included in the semiconductor platform 150. In some implementations, the semiconductor platform test circuitry 104 may arrange test blocks 122 to generate information and/or data representative of a test method that includes a number of test methods generated by resequencing, rearranging, shuffling, or permutating the test blocks 122 associated with a semiconductor platform feature 120 or group of features 120.

The semiconductor platform test circuitry 104 includes logic, electrical components, semiconductor devices, and logic elements to generate information and/or data representative of semiconductor platform 150 test reporting 232. In embodiments, such test reporting 232 may include, but is not limited to, one or more semiconductor platform 150 performance parameters obtained prior to, during, and/or after the execution of one or more test methods 230 on the semiconductor platform 150. In embodiments, such test reporting 232 may include, but is not limited to, a PASS or FAIL test reporting 232 indicative of whether the performance of the tested semiconductor platform feature 120 falls within acceptable limits.

Figure 3:
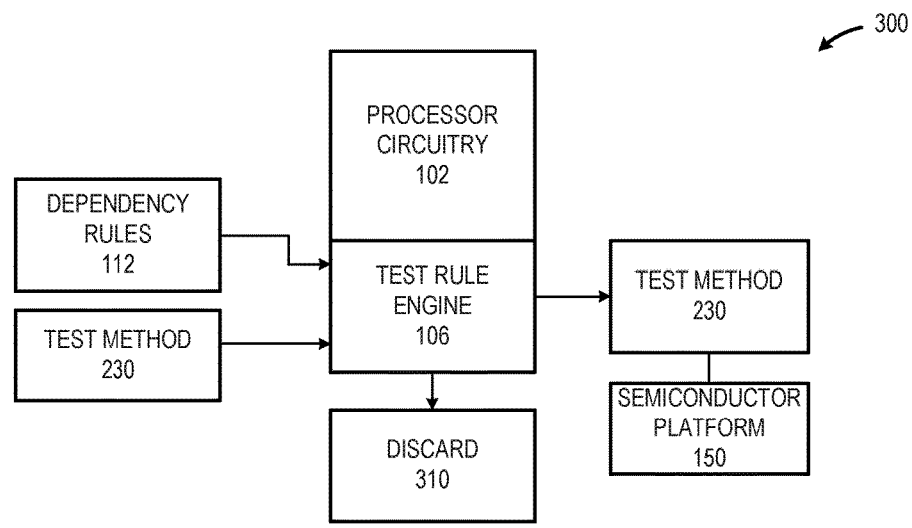
FIG. 3 is an input/output (I/O) diagram depicting a number of example inputs and a number of example outputs associated with an illustrative test rule engine implemented by processor circuitry, in accordance with at least one embodiment described herein.

FIG. 3 is an input/output (I/O) diagram 300 depicting a number of example inputs and a number of example outputs associated with an illustrative test rule engine 106 implemented by processor circuitry 102, in accordance with at least one embodiment described herein. As depicted in FIG. 3, the test rule engine 106 receives at least one input that includes information and/or data associated with one or more test methods 230 and information and/or data associated with one or more dependency rules 112. The dependency rules 112 include information and/or data indicative of conditions precedent, conditions subsequent, and/or incompatibilities between the test blocks 122 forming each test method 230. Thus, as the semiconductor platform test circuitry 104 generates new test methods 230 by generating a number of test block permutations, the test rule engine 106 determines whether each of the generated test methods 230 violate any of the dependency rules 112. Test methods 230 that are found by the test rule engine 106 to violate one or more dependency rules 112 are discarded 310. The test rule engine 106 also detect duplicative test methods 230. The test rule engine 106 also discards duplicative test methods 230. The test rule engine 106 communicates or otherwise transmits information and/or data representative of each of the valid test methods 230 to the semiconductor platform 150.

Figure 4:
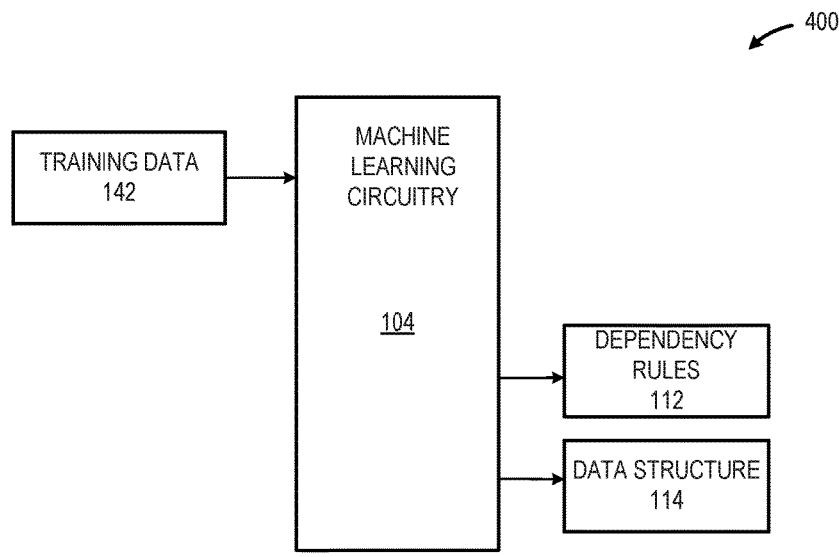
FIG. 4 is an input/output (I/O) diagram depicting a number of example inputs and a number of example outputs associated with an illustrative machine learning circuit, in accordance with at least one embodiment described herein.

FIG. 4 is an input/output (I/O) diagram 400 depicting a number of example inputs and a number of example outputs associated with an illustrative machine learning circuit 140, in accordance with at least one embodiment described herein. As depicted in FIG. 4, the machine learning circuit 140 receives at least one input that includes information and/or data associated with training data 142. In embodiments, the training data 142 includes information and/or data indicative of semiconductor platform features 120 and those test methods 230 logically associated with each of the semiconductor platform features 120. Each of the test methods 230 used as training data 142 includes a number of test blocks 122 that include invalid test block sequences and/or invalid logical feature 120/test block 122 associations (e.g., negative training data sets); valid test block sequences and/or valid logical feature/test block 122 associations (e.g., positive training data sets); or combinations thereof.

The machine learning circuit 140 generates outputs that include, but are not limited to: information and/or data indicative of the dependency rules 112 and information and/or data indicative of the logical associations between semiconductor platform features 120 and test methods 230/test blocks 122. In some implementations, the output from the machine learning circuit 140 may be stored in, on, or about or otherwise retained by the storage device 110. In some implementations, at least some of the dependency rules 112 and the logical association information and/or data may be stored remotely, for example on a cloud based server or similar. In some implementations, the logical association information and/or data may be stored or otherwise retained in one or more data structures 114 disposed in, on, or about the storage device 110.

Figure 5:
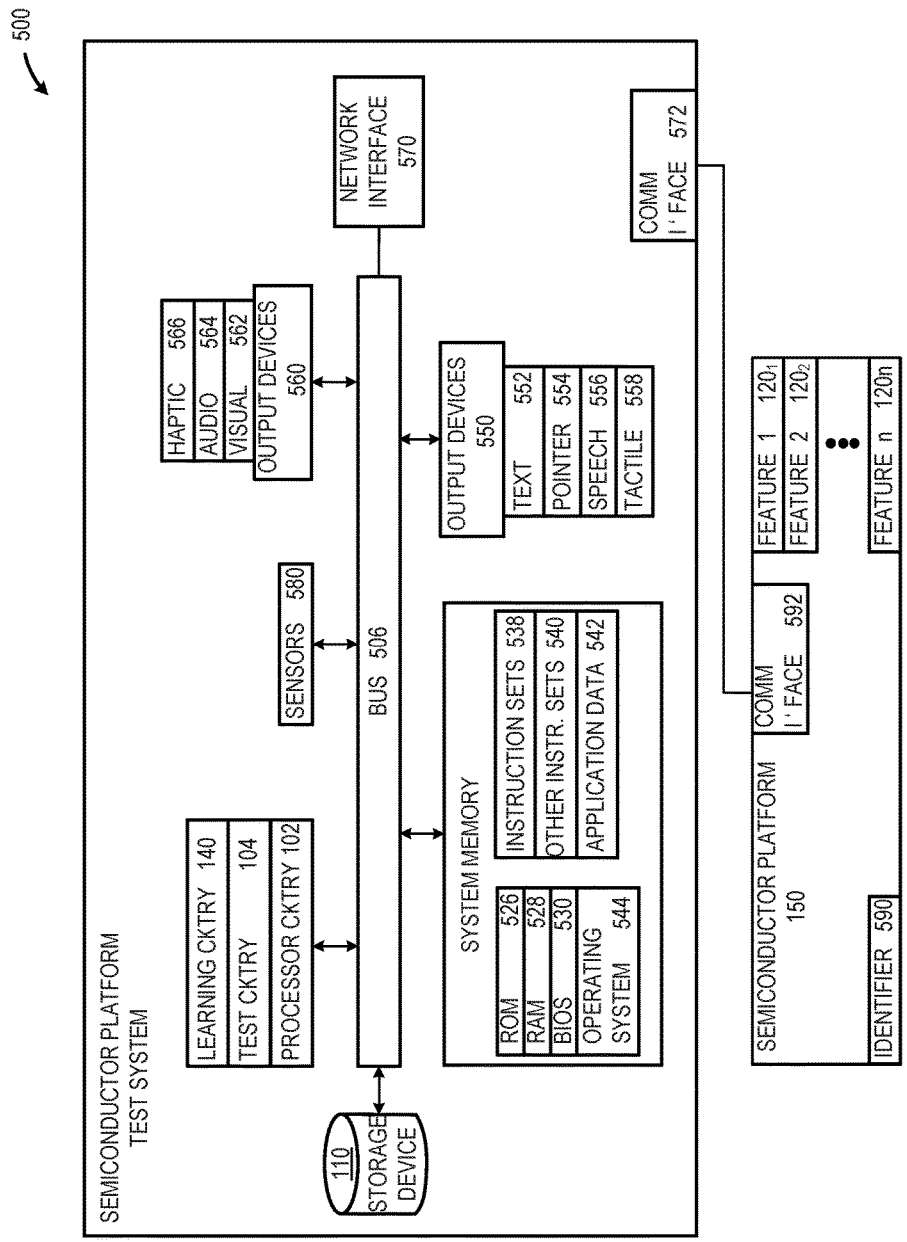
FIG. 5 and the following discussion provide a brief, general description of the components forming an illustrative system that includes semiconductor platform test system that incorporates logic devices, logic systems, logic elements, and/or processor circuitry capable of providing semiconductor platform test circuitry, test rule engine, and/or machine learning circuit, in accordance with at least one embodiment described herein.

FIG. 5 and the following discussion provide a brief, general description of the components forming an illustrative system 500 that includes semiconductor platform test system 100 that incorporates logic devices, logic systems, logic elements, and/or processor circuitry 102 capable of providing semiconductor platform test circuitry 104, test rule engine 106, and/or machine learning circuit 140, in accordance with at least one embodiment described herein.

At least some embodiments or implementations may include machine-readable or computer-executable instruction sets, such as program application modules, objects, or macros being executed by the semiconductor platform test circuitry 104 and/or the test rule engine 106. At least some embodiments or implementations may include circuitry implemented in the form of hard-wired circuitry and components, semiconductor circuitry, logic systems, logic elements, logic devices, logic modules, logic systems/sub-systems, microprocessors, controllers, or similar devices that provide the various components, systems, sub-systems, or modules included in the semiconductor platform test system 100.

Those skilled in the relevant art will appreciate the illustrated embodiments as well as other embodiments may be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like. The embodiments can be practiced in distributed computing environments where tasks or modules are performed by remote processing devices, which are linked through a communications network. Program modules may be disposed in both local and remote memory storage devices in a distributed computing environment.

The semiconductor platform test system 100 may include processor circuitry 102 which may include a variety of electronic and/or semiconductor components that are disposed at least partially within a wearable computer, portable computing device, personal digital assistant, personal computer, blade server, workstation, rack mount blade server, or other similar current or future processor-based devices and/or systems capable of executing machine-readable instructions. The processor circuitry 102 may be interconnected with, electrically coupled, and/or communicably coupled to various components within the semiconductor platform test system 100 via one or more serial or parallel conductors, pathways, or buses 506. As depicted in FIG. 5, all or a portion of the processor circuitry 102 may be apportioned or allocated to providing, forming, or otherwise producing all or a portion of the semiconductor platform test circuitry 104, test rule engine 106, and/or machine learning circuitry 140.

As depicted in FIG. 5, system components such as the system memory 520 may be communicably coupled to the processor circuitry 102 via the bus 506. The semiconductor platform test system 100 may, at times, be referred to in the singular herein, but this is not intended to limit the embodiments to a single system, since in certain embodiments, there will be more than one semiconductor platform test system 100, networked semiconductor platform test systems 100, client/server semiconductor platform test systems 100, or other networked systems, circuits, or devices included.

The processor circuitry 102 may include any number, type, or combination of conductors, insulators, electrical devices, and/or semiconductor components. At times, the processor circuitry 102 may be implemented in whole or in part in the form of semiconductor devices such as diodes, transistors, inductors, capacitors, and resistors. Such an implementation may include, but is not limited to any current or future developed single- or multi-core processor or microprocessor, such as: one or more systems on a chip (SOCs); one or more central processing units (CPUs); one or more digital signal processors (DSPs); one or more graphics processing units (GPUs); one or more application-specific integrated circuits (ASICs), one or more field programmable gate arrays (FPGAs), and the like. Unless described otherwise, the construction and operation of the various blocks shown in FIG. 5 are of conventional design. As a result, such blocks need not be described in further detail herein, as they will be understood by those skilled in the relevant art. The bus 506 that interconnects at least some of the components may employ any known serial or parallel bus structures or architectures.

The system memory 520 may include read-only memory ("ROM") 526 and random access memory ("RAM") 528 in any number, capacity, and/or configuration. A portion of the ROM 526 may contain a basic input/output system ("BIOS") 530. The BIOS 530 may provide basic functionality to the semiconductor platform test system 100. For example, by causing the processor circuitry 102 to load one or more machine-readable instruction sets that cause the all or a portion of the processor circuitry 102 to provide and function as the semiconductor platform test circuitry 104, the test rule engine 106, and/or the machine learning circuitry 140. The system memory 520 may also include one or more other instruction sets 540 useful for providing one or more functional aspects of the semiconductor platform test system 100. The system memory 520 may also include one or more application specific instruction sets 542, such as one or more spreadsheet, word processing, e-mail, or similar programs. The system memory 520 may also include information and/or data associated with an operating system 544 used to boot or otherwise initiate operation of the semiconductor platform test system 100.

The semiconductor platform test system 100 may include one or more communicably coupled, non-transitory, data storage devices 110. The one or more data storage devices 110 may include any number and/or combination of any current or future developed non-transitory storage devices and/or memory. Non-limiting examples of such non-transitory, data storage devices 110 may include, but are not limited to, one or more magnetic storage devices, one or more optical storage devices, one or more solid-state electromagnetic storage devices, one or more electroresistive storage devices, one or more molecular storage devices, one or more quantum storage devices, or various combinations thereof. In some implementations, the data storage devices 110 may be disposed remote from the semiconductor platform test system 100. In some implementations, the data storage devices 110 may include one or more hot-pluggable or removable data storage devices.

One or more interfaces and/or controllers (not shown in FIG. 5) may communicably couple the one or more storage devices 110 to the bus 506. The one or more storage devices 110 may contain machine-readable instruction sets, data structures, program modules, and other data useful to the semiconductor platform test circuitry 104, the test rule engine 106, and/or the machine learning circuitry 140.

The semiconductor platform test system 100 may include any number or combination of sensors 580 capable of detecting markings, indicia, or similar identifiers disposed in, on, or about the semiconductor platform 150. In some implementations, such sensors 580 may include any number and/or combination of one or more of the following: image sensors (e.g., one or more charge coupled device (CCD) or complementary metal oxide semiconductor (CMOS) image sensors, or similar); infrared illuminators/infrared image acquisition sensors; one or more two-dimensional or three-dimensional bar code readers. In at least some implementations, such sensors 580 may autonomously collect semiconductor platform 150 information and/or data on a continuous or intermittent basis at regular, irregular, periodic, or aperiodic intervals.

Machine-readable instruction sets and/or applications 538 may be stored or otherwise retained in whole or in part in the storage device 110 or in whole or in part, in system memory 520. Such instruction sets 538 may be transferred from one or more storage devices 110 and stored in the system memory 520 in whole or in part for execution by the processor circuitry 102. The machine-readable instruction sets 538 may include instructions and/or logic providing the autonomously semiconductor platform test generation method described herein. For example, one or more applications 538 may cause the processor circuitry 102 to provide semiconductor platform test circuitry 104, test rule engine 106, and/or machine learning circuitry 140 as described above in FIG. 1 through FIG. 4.

The semiconductor platform test system 100 may include one or more communicably coupled physical input devices 550, such as one or more text entry devices 552 (e.g., keyboard), one or more pointing devices 554 (e.g., mouse, trackball, touchscreen), one or more audio input devices 556 and/or one or more tactile input devices 558. Such physical input devices 550 may be used, for example, to provide, enter, or otherwise supply commands (e.g., acknowledgements, selections, confirmations, and similar) as well as information (e.g., acknowledgements, and similar) to the semiconductor platform test system 100. The semiconductor platform test system 100 may include one or more communicably coupled physical output devices 560, such as one or more visual output devices 562 (e.g., a display device), one or more audio output devices 564, one or more tactile output devices 566 (e.g., haptic feedback or similar), or combinations thereof.

The semiconductor platform test system 100 may include one or more network interfaces 570 to provide communications capabilities with one or more additional external devices, systems, and/or services. In some implementations, the one or more network interfaces 570 may include one or more wireless interfaces, such as one or more IEEE 802.11 (Wi-Fi®) compliant interfaces. In some implementations, the one or more network interfaces 570 may include one or more wired interfaces, such as one or more IEEE 802.3 ("Ethernet") compliant interfaces.

The semiconductor platform test system 100 may include a communication interface 572 to communicably couple to and exchange information and/or data with the semiconductor platform 150. In embodiments, the communication interface 572 may include one or more wired or wireless interfaces. In embodiments, the communication interface 572 may exchange information and/or data (e.g., test methods, test results, and similar) with the semiconductor platform 150 using one or more standard communications protocols, such as Near Field Communication (NFC); Wi-Fi®; Bluetooth®; Ethernet; etc. In some embodiments, the communications interface 572 may exchange information and/or data with the semiconductor platform 150 using one or more proprietary communications protocols.

For convenience, the network interface 570, the processor circuitry 102, the system memory 520, the physical input devices 550 and the physical output devices 560 are illustrated as communicatively coupled to each other via the bus 506, thereby providing connectivity between the above-described components. In alternative embodiments, the above-described components may be communicatively coupled in a different manner than illustrated in FIG. 5. For example, one or more of the above-described components may be directly coupled to other components, or may be coupled to each other, via one or more intermediary components (not shown). In some embodiments, the bus 506 may be omitted and the components are coupled directly to each other using suitable wired or wireless connections.

The semiconductor platform 150 includes a communication interface 592 that permits the communicable coupling of the semiconductor platform 150 with the semiconductor platform test system 100. The semiconductor platform 150 may also include one or more identifiers 590. In embodiments, the one or more identifiers 590 may be communicated to the semiconductor platform test system 100. In embodiments, the semiconductor platform test system 100 may use at least a portion of the received semiconductor platform identifier 590 to determine the features 120 included in, on, or about the semiconductor platform 150.

Figure 6:
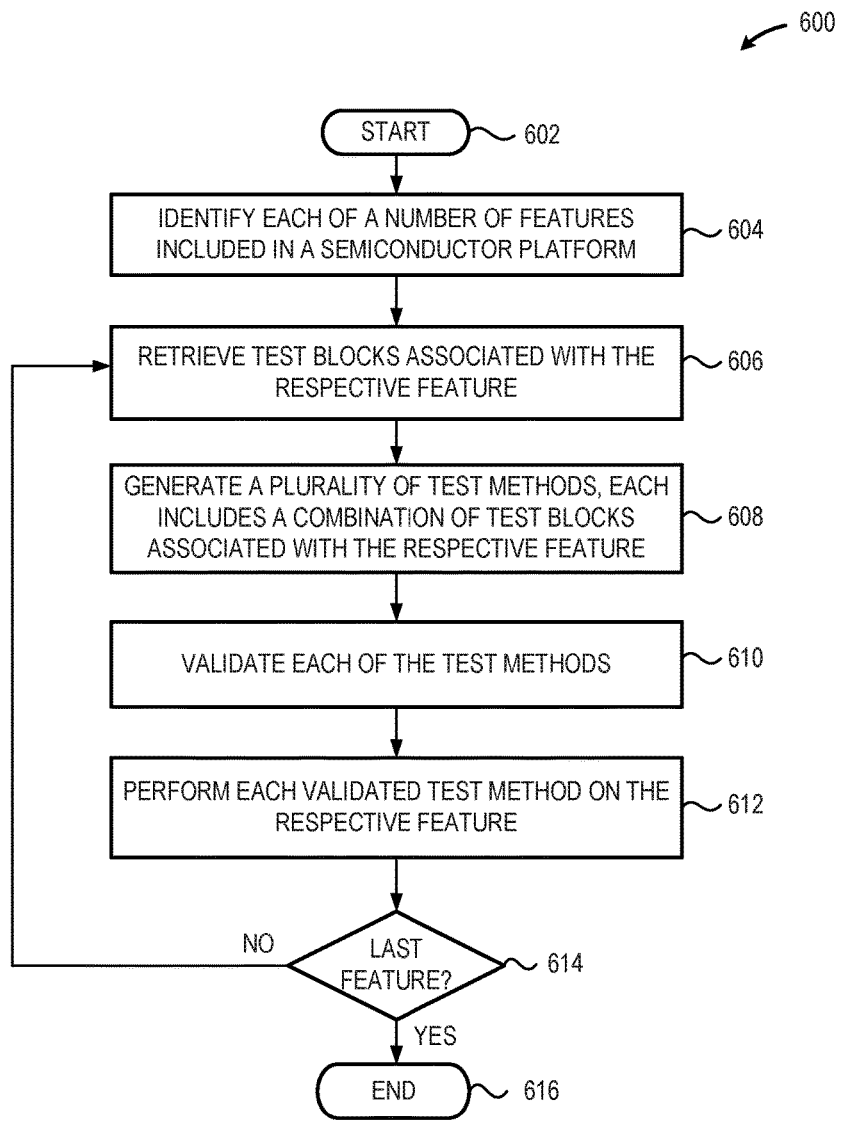
FIG. 6 is a logic flow diagram of an illustrative semiconductor platform test method that includes semiconductor platform test circuitry that provides autonomous test method generation using a defined number of test blocks logically associated with each feature included in a semiconductor platform, in accordance with at least one embodiment described herein.

FIG. 6 is a logic flow diagram of an illustrative semiconductor platform test method 600 that includes semiconductor platform test circuitry 104 that provides autonomous test method generation using a defined number of test blocks 122 logically associated with each feature 120 included in a semiconductor platform 150, in accordance with at least one embodiment described herein. Each feature 120 included in a semiconductor platform 150 is tested by test methods 230 formed by sequencing a plurality of test blocks 122 that are logically associated with the respective feature 120. Manual development of test methods 230 is costly, labor intensive, and prone to variability based on the programming practices of the coder entering the test method 230. Such variabilities in coding lead to inconsistency in testing and, potentially, flaws or "bugs" that escape the testing process. Furthermore, human and fiscal resource limitations often limit testing to "most likely" scenarios, which given the wide variety of end users and end user applications, often leads to discovery of "less likely" bugs in the field. Automating the test method generation process beneficially and advantageously permits the testing of a greater number of scenarios, including those corresponding to "less likely" scenarios leading to a more robust and reliable semiconductor platform 150. The method 600 commences at 602.

At 604, the semiconductor platform test circuitry 104 receives information and/or data indicative of the features 120 present in, on, or about the semiconductor platform 150 to be tested. In embodiments, the information and/or data indicative of the features 120 may be manually entered into the semiconductor platform test system 100 via one or more input devices 550. In other embodiments, the semiconductor platform test circuitry 104 may receive a user input that includes information and/or data, such as a serial number, model number, part number, SKU, etc., that is indicative of the semiconductor platform 150 and the various features 120 included on the semiconductor platform 150. The semiconductor platform test circuitry 104 may then use the user-provided information and/or data to look-up or otherwise retrieve information and/or data indicative of the features 120 using one or more data structures. In other embodiments, the semiconductor platform test system 100 may include one or more sensors capable of reading one or more indicia attached to or included in, on, or about the semiconductor platform 150. Such indicia may include a two-dimensional code, a three-dimensional code, a serial number, or any other indicia capable of providing the semiconductor platform test circuitry 104 with information and/or data indicative of the features included in, on, or about the semiconductor platform 150.

At 606, for each of at least some features 120 identified by the semiconductor platform test circuitry 104 as associated with the semiconductor platform 150, the semiconductor platform test circuitry 104 retrieves test blocks 122 associated with the respective feature 120. In some implementations, the semiconductor platform test circuitry 104 may retrieve the test blocks 122 from one or more data structures 114 stored or otherwise retained in, on, or about the storage device 110.

At 608, using the test blocks 122 retrieved at 606, the semiconductor platform test circuitry 104 generates a plurality of test methods 230. Each of the plurality of test methods 230 may include some or all of the test blocks 122 retrieved at 606. The semiconductor platform test circuitry 104 generates a number of test block 122 permutations in which the test blocks 122 are resequenced, with each respective sequence providing a potential test method 230 for implementation on the semiconductor platform 150. In at least some implementations, where "n" test blocks 122 are identified as logically associated with the respective feature 120, the number of potential test block sequences may include up to n! (n factorial) test methods 230.

At 610, the test rule engine circuitry 106 may validate each of the test methods 230 generated by the semiconductor platform test circuitry 104. The test rule engine circuitry 106 may retrieve one or more dependency rules 112 stored or otherwise retained in, on, or about the storage device 110. Each dependency rule 112 may provide one or more conditions precedent (e.g., which test blocks 122 included in the test method 230 must be executed prior to a particular test block); one or more conditions subsequent (e.g., which test blocks 122 included in the test method 230 must be executed after a particular test block); and/or one or more incompatibilities (e.g., which test blocks 122 cannot be executed in the same test method 230 with a particular test block 122).

In embodiments, the dependency rules 112 applied to the test blocks 122 may be affected by the presence of particular feature combinations present in the semiconductor platform 150. For example, feature 120A may include test methods formed using test blocks "AA," "BB," and "CC" in the absence of feature 120B on the same semiconductor platform 150. However, when both feature 120A and feature 120B are present on the same semiconductor platform 150, feature "A" may include test methods formed using test blocks "AA," "BB," "CC," "DD," and "EE."

In embodiments, the test rule engine circuitry 106 also detects duplicate test methods 230. The test rule engine circuitry 106 discards any test methods 230 found to violate one or more dependency rules or any test methods 230 that are found to be duplicates.

At 612, the semiconductor platform test circuitry 104 causes the execution of the test method 230 by the semiconductor platform 150. The semiconductor platform test circuitry 104 monitors the execution of the test method 230 by the semiconductor platform 150 and receives test results from the semiconductor platform 150.

At 614, the semiconductor platform test circuitry 104 determines whether the most recent feature 120 is the last feature on the semiconductor platform 150 to be tested. If additional features remain to be tested, the method 600 returns to 606. If the feature most recently tested was the last feature 120, the method 600 concludes at 616.

Figure 7:
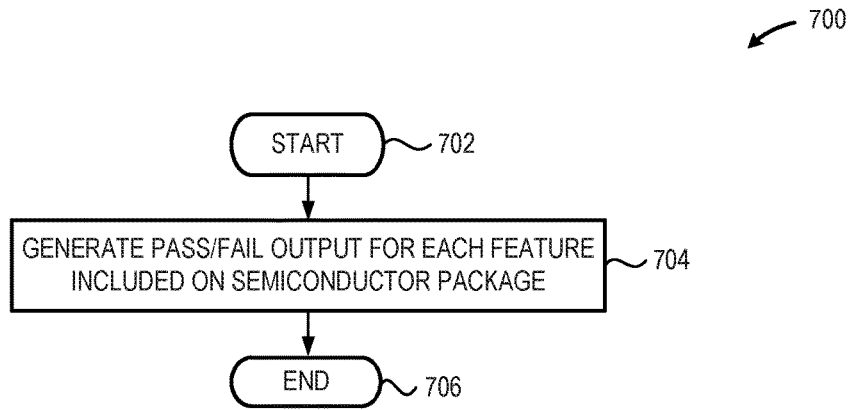
FIG. 7 is a high-level logic flow diagram that includes the illustrative generation of a PASS/FAIL output by the semiconductor platform test circuitry, in accordance with at least one embodiment described herein.

FIG. 7 is a high-level logic flow diagram 700 that includes the illustrative generation of a PASS/FAIL output by the semiconductor platform test circuitry 104, in accordance with at least one embodiment described herein. The semiconductor platform test system 100 provides an automated semiconductor platform test generation method in which the semiconductor platform test circuitry 104 generates a plurality of test methods 230 for some or all of the features included in, on, or about a semiconductor platform 150. The autonomous generation of a large number of test methods 230 may generate a large number of test results. In at least some implementations, the semiconductor platform test circuitry 104 may generate test results that are reported to the system user or are logged or otherwise stored for later review. The method commences at 702.

At 704, the semiconductor platform test circuitry 104 generates one or more indicia indicative of whether the semiconductor platform 150 has passed or failed a test method 230 generated by the semiconductor platform test circuitry 104 to test one or more features 120 included in, on, or about the semiconductor platform 150. In some embodiments, the indicia may include one or more test method identifiers and a binary PASS/FAIL indication. In some embodiments, the indicia may include information and/or data collected by the semiconductor platform test circuitry 104 during the execution of the test method 230 by the semiconductor platform 150. In some implementations, the results may be presented in tabular or similar format. In some implementations, the semiconductor platform test circuitry 104 may save, store, or otherwise retain at least some of the test results on the storage device 110. The method 700 concludes at 706.

Figure 8:
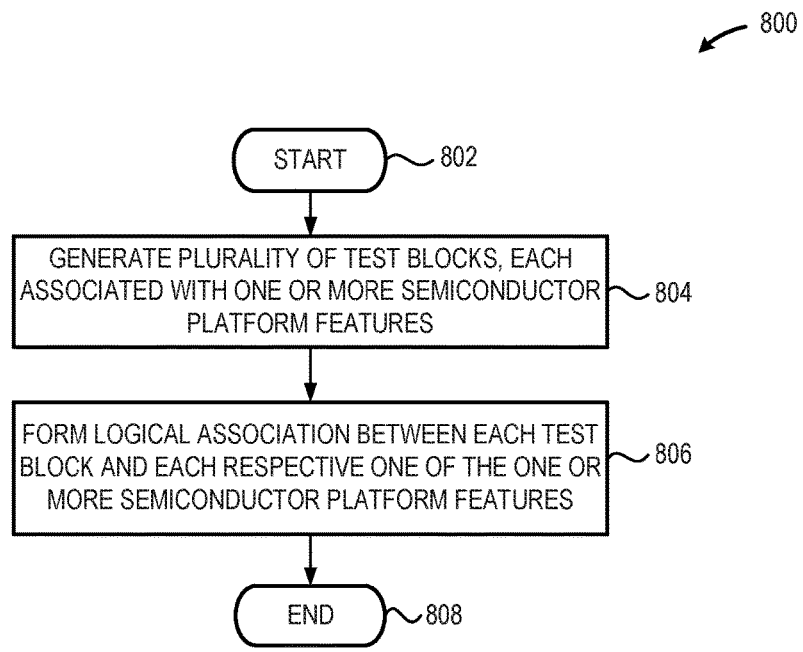
FIG. 8 is a high-level logic flow diagram of an illustrative method for generating a data structure that includes a plurality of features, each logically associated with a number of test blocks useful for developing a test method to test the respective feature on a semiconductor platform, in accordance with at least one embodiment described herein.

FIG. 8 is a high-level logic flow diagram of an illustrative method 800 for generating a data structure 114 that includes a plurality of features 120, each logically associated with a number of test blocks 122 useful for developing a test method 230 to test the respective feature on a semiconductor platform 150, in accordance with at least one embodiment described herein. In some implementations, the generation of test blocks 122 may be performed manually. In some implementations, the system user may provide one or more inputs that logically associate test blocks 122 and/or test methods 230 with a specific feature 120 included in, on, or about a semiconductor platform 150. The method 800 commences at 802.

At 804, a plurality of test blocks 122 are generated. In embodiments, each of the test blocks 122 may be manually generated by a system user. In embodiments, each of the test blocks 122 may be manually generated. For example, the test blocks 122 maybe generated using one or more user defined languages (UDLs) or similar having a syntax and argument structure that ensures uniformity, reproducibility, and consistency across test blocks 122.

In embodiments using manually entered test blocks 122, the semiconductor platform test system 100 may include UDL task block generation circuitry 130. The UDL task block generation circuitry 130 may include at least parser circuitry 132 and code generator circuitry 134. In embodiments, a system user may enter test block information and/or data in a UDL format (i.e., entering test blocks 122 using a defined UDL syntax and a defined UDL parameter stack). The parser circuitry 132 parses the UDL format test block entered by the system user and the code generator 134 autonomously generates machine executable code representative of the test block 122 entered by the system user. In embodiments, the machine-executable test block 122 may be stored or otherwise retained in a data structure 114 disposed in, on, or about the storage device 110. In embodiments, the test blocks 122 form a "library" that is reused in forming test methods 230 for both current and future developed semiconductor platforms 150.

At 806, a logical association is formed between the test block 122 and the semiconductor platform features 120 that use the test block 122 in one or more test methods 230. A test block 122 may be logically associated with one or more semiconductor platform features 120. The logical association between the test block 122 and one or more semiconductor platform features 120 may be formed based on information and/or data provided by the system user. The method 800 concludes at 808.

Figure 9:
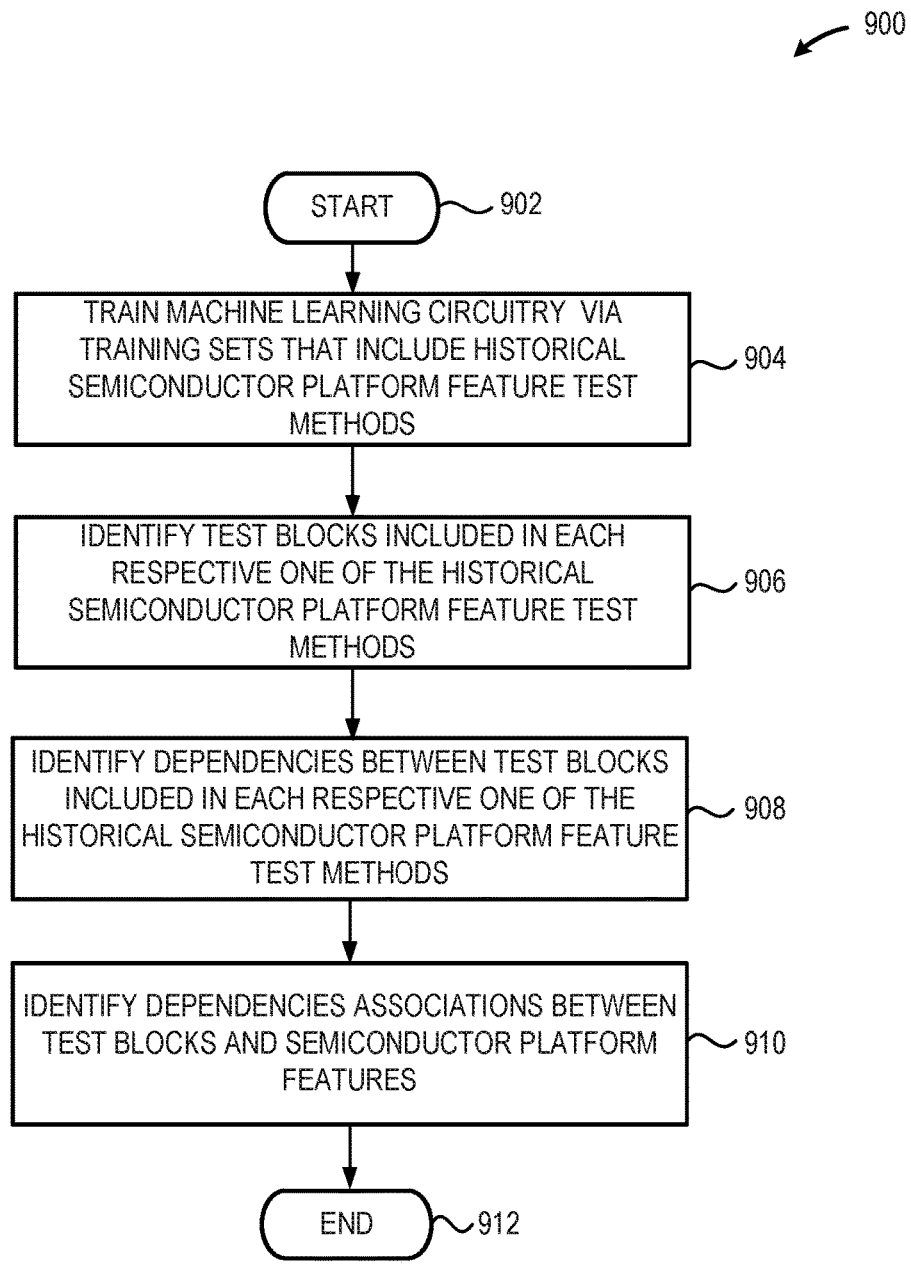
FIG. 9 is a high-level logic flow diagram of illustrative method of autonomously learning test blocks, test block dependency rules, and/or logical associations between semiconductor platform features and test blocks using machine learning circuitry communicably coupled to or integrated with the semiconductor platform test system, in accordance with at least one embodiment described herein.

FIG. 9 is a high-level logic flow diagram 900 of illustrative method of autonomously learning test blocks 122, test block dependency rules 112, and/or logical associations between semiconductor platform features 120 and test blocks 122 using machine learning circuitry 140 communicably coupled to or integrated with the semiconductor platform test system 100, in accordance with at least one embodiment described herein. In some implementations, the semiconductor platform test system 100 may include communicably coupled machine learning circuitry 140 to populate a data structure 114 that includes semiconductor platform features 120 and test blocks 122 logically associated therewith. The method 900 commences at 902.

At 904, the machine learning circuitry 140 is trained using training data sets $142_1$-$142_n$ that include information and/or data indicative of one or more historical test methods 230 and the semiconductor platform features 120 logically associated with the respective one or more historical test methods. The training data sets 142 may include positive training data sets that include information and/or data representative of semiconductor platform features 120 and/or the logically associated valid test methods 230. The training data sets 142 may include negative training data sets that include information and/or data representative of one or more invalid test methods 230 (e.g., test methods that contain incorrectly sequenced test blocks 122—test blocks that fails to satisfy one or more conditions precedent or conditions subsequent) and/or test blocks that are logically associated with an incorrect semiconductor platform feature 120.

At 906, the machine learning circuitry 140 identifies the test blocks 122 included in each of the historical semiconductor platform test methods 230. In embodiments, the machine learning circuitry 140 may store or otherwise retain information and/or data representative of the identified test blocks 122 in the data structure 114 disposed in, on, or about the storage device 110.

At 908, the machine learning circuitry 140 identifies dependencies between the test blocks 122 included in each of the historical semiconductor platform test methods 230. In embodiments, the machine learning circuitry 140 may store or otherwise retain information and/or data representative of the identified test block dependencies in the dependency rules 112 disposed in, on, or about the storage device 110.

At 910, the machine learning circuitry 140 identifies logical associations between the test blocks 122 and the semiconductor platform features 120. In embodiments, the machine learning circuitry 140 may store or otherwise retain information and/or data representative of the identified logical associations in the data structure 114 disposed in, on, or about the storage device 110. The method 900 concludes at 912.

Figure 10:
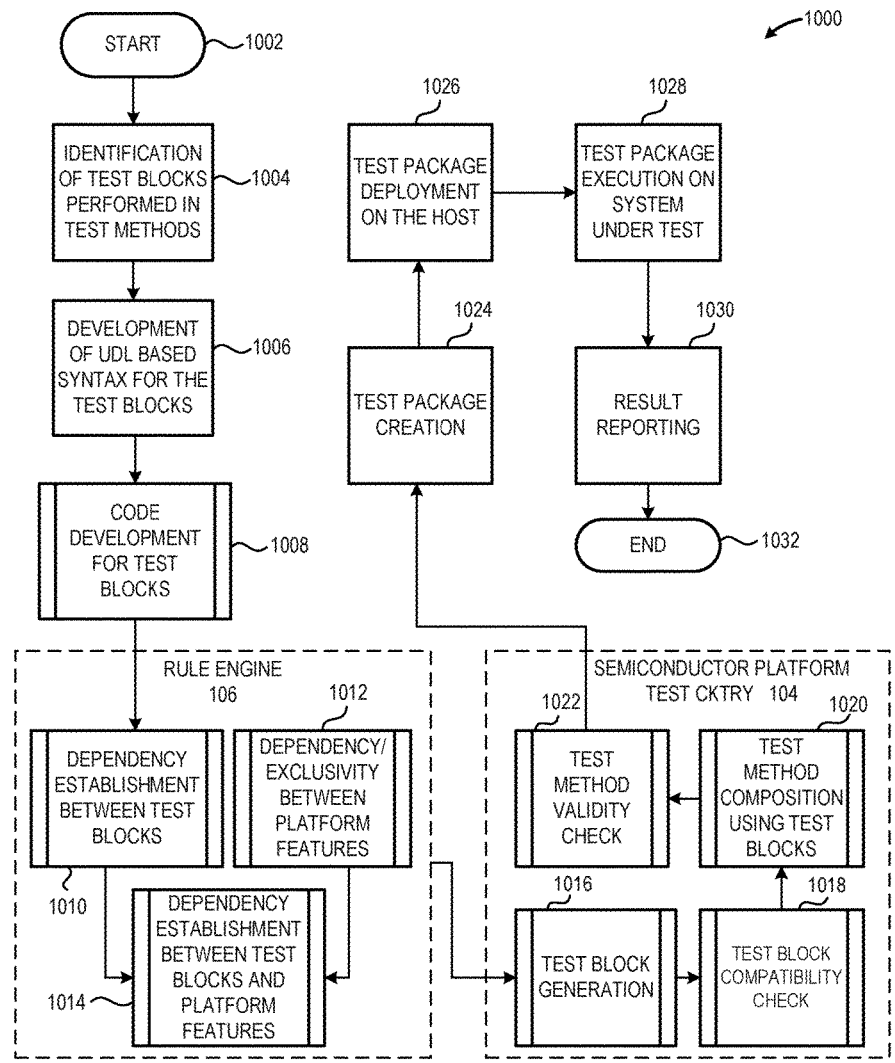
FIG. 10 is a high-level logic flow diagram of an illustrative method of autonomously generating semiconductor platform feature test methods, in accordance with at least one embodiment described herein.

FIG. 10 is a high-level logic flow diagram of an illustrative method 1000 of autonomously generating semiconductor platform feature test methods 230, in accordance with at least one embodiment described herein. The method 1000 depicted in FIG. 10 uses manually entered test block 122, test block dependency 112, and test block/semiconductor platform feature logical association information and/or data. The method 1000 commences at 1002.

At 1004, information and/or data representative of one or more test blocks 122 used in one or more test methods 230 is received by the semiconductor platform test system 100. In some implementations, information and/or data may be manually entered by a system user. For example, the system user may use the UDL task block generation circuitry 130 to enter information and/or data representative of the one or more test blocks 122.

At 1006, a user defined language (UDL) based syntax is developed for each of the test blocks 122. In some implementations, the UDL-based syntax may include one or more commands or similar and one or more parameters, parameter ranges, or similar.

At 1008, machine-executable code is developed for each of the test blocks 122. In at least some implementations, the code generation circuitry 132 in the UDL task block generation circuitry 130 may autonomously perform at least a portion of the machine-executable code generation.

At 1010, the semiconductor platform test system 100 receives information and/or data representative of dependency rules between test blocks 122. In some implementations, such as depicted in FIG. 10, the test rule engine circuitry 106 may receive all or a portion of the information and/or data representative of dependency rules between test blocks 122. Such dependency rules may include, but are not limited to, conditions precedent, conditions subsequent, and/or incompatibilities between test blocks 122. In embodiments, the semiconductor platform test circuitry 104 may store or retain all or a portion of the received information and/or data representative of dependency rules between test blocks 122 in the storage device 110.

At 1012, the semiconductor platform test system 100 receives information and/or data representative of dependency rules between semiconductor platform features 120. In some implementations, such as depicted in FIG. 10, the test rule engine circuitry 106 may receive all or a portion of the information and/or data representative of dependency rules between semiconductor platform features 120. Such dependency rules may include, but are not limited to, dependencies and/or exclusivities between semiconductor platform features 120. In embodiments, the semiconductor platform test circuitry 104 may store or retain all or a portion of the received information and/or data representative of dependency rules between semiconductor platform features 120 in the storage device 110.

At 1014, the semiconductor platform test system 100 receives information and/or data representative of logical associations between test blocks 122 and semiconductor platform features 120. In some implementations, such as depicted in FIG. 10, the test rule engine circuitry 106 may receive all or a portion of the information and/or data representative of logical associations between semiconductor platform features 120 and test blocks 122. In embodiments, the semiconductor platform test circuitry 104 may store or retain all or a portion of the received information and/or data representative of logical associations between semiconductor platform features 120 and the test blocks 122 in the storage device 110.

At 1016, the semiconductor platform test circuitry 104 selects test blocks 122 for inclusion in one or more test methods 230. The one or more test methods 230 and consequently, the test blocks 122, may be selected based, at least in part, on the presence of one or more semiconductor platform features 120.

At 1018, the semiconductor platform test circuitry 104 determines the compatibility of the test blocks selected at 1016. Generally, test blocks included in a single test method 230 will be compatible. However, it is conceivable that a combination of semiconductor platform features 120 may result in the selection of test methods 230 that contain incompatible test blocks 122.

At 1020, the semiconductor platform test circuitry 104 combines the test blocks 122 selected at 1016 into a test method 230. Using some or all of the test blocks 122, the semiconductor platform test circuitry 104 generates additional test methods 230 by altering the sequence of the test blocks 122 (i.e., generating test block permutations).

At 1022, the semiconductor platform test circuitry 104 confirms the validity of each of the test methods 230 generated at 1020. In some implementations, the semiconductor platform test circuitry 104 may use the dependency rules 112 that are stored or retained in, on, or about the storage device 110 to assess the validity of each test method 230. The validity of a particular test method may be based on any measurable or detectable parameter, including but not limited to: conditions precedent (e.g., if test block 122B is dependent on prior execution of test block 122A, does test block 122A appear in the test method prior to test block 122B); conditions subsequent (e.g., if test block 122B is dependent on subsequent execution of test block 122C, does test block 122C appear in the test method after test block 122B); sequencing requirements (e.g., if test block 122C must be executed immediately after test block 122B, do test blocks 122B and 122C appear in sequence in the test method 230); and similar. Test methods 230 found to violate one or more dependency rules are discarded and not executed as part of the semiconductor platform test package.

At 1024, the semiconductor platform test circuitry 104 combines the test methods 230 generated at 1020 and found valid at 1022 to create a test package used to test one or more features 120 on the semiconductor platform 150.

At 1026, the semiconductor platform test circuitry 104 transmits or otherwise communicates the test package to the system or device coupled to the semiconductor platform 150 to be tested. In some implementations, the semiconductor platform test circuitry 104 may deploy the test package directly to the semiconductor platform 150.

At 1028, the semiconductor platform 150 executes the test methods 230 included in the test package provided by the semiconductor platform test circuitry 104. In some implementations, each test method 230 is executed by the semiconductor platform 150 sequentially. In some implementations, some or all of the test methods 230 included in the test package may be executed in parallel by the semiconductor platform 150.

At 1030, the semiconductor platform test circuitry 104 receives test results from the semiconductor platform 150. In embodiments, the test results may include a simple PASS/FAIL indication for each of some or all of the test methods 230 included in the test package. In embodiments, the test results received by the semiconductor platform test circuitry 104 may include information and/or data collected by the semiconductor platform 150 or by one or more sensors, monitors, or ancillary devices communicably coupled to the semiconductor platform 150 and indicative of one or more test parameters. The method concludes at 1032.

While FIGS. 6, 7, 8, 9, and 10 illustrate various operations according to one or more embodiments, it is to be understood that not all of the operations depicted in FIGS. 6, 7, 8, 9, and 10 are necessary for other embodiments. Indeed, it is fully contemplated herein that in other embodiments of the present disclosure, the operations depicted in FIGS. 6, 7, 8, 9, and 10, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eM-MCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for autonomously generating test methods for testing features included on semiconductor platforms. The systems and methods described herein either manually or autonomously receive information and/or data indicative of the features included in, on, or about a semiconductor platform to be tested. Based on the presence of features and/or feature combinations on the semiconductor platform, the systems and methods described herein autonomously select the appropriate test blocks used to generate the test method. The systems and methods described herein generate additional test methods as permutations of the selected test blocks. The validity of each test method is confirmed using dependency rules and all valid test methods are combined to form a test package that is used to test the semiconductor platform. Such systems and methods beneficially improve accuracy, consistency, and repeatability of testing through the use of standard test blocks to generate the test methods. Such systems and methods beneficially improve the reliability of semiconductor platforms by performing a significantly greater number of tests on the semiconductor platform than could previously be performed using manually entered test code.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for automated semiconductor platform testing.

According to example 1, there is provided a semiconductor platform test method. The method may include: generating a plurality of test blocks, each of the plurality of test blocks logically associated with assessing an operability parameter of at least one semiconductor platform feature; forming a logical association between each of the plurality of test blocks and each of at least one respective semiconductor platform feature; identifying, by semiconductor platform test circuitry, each of a number of features included in a semiconductor platform; for each respective identified feature included in the semiconductor platform: retrieving, by the semiconductor platform test circuitry, one or more test blocks logically associated with the respective feature from the plurality of test blocks; generating, by the semiconductor platform test circuitry, a plurality of test methods, each of the plurality of test methods including a respective permutation of the one or more retrieved test blocks; and validating, by the semiconductor platform test circuitry, each of the plurality of test methods; and performing, by the semiconductor platform test circuitry, each of the plurality of test methods on the semiconductor platform.

Example 2 may include elements of example 1 where validating each of the plurality of test methods may include, for each respective identified feature present in the semiconductor platform: detecting, by the semiconductor platform test circuitry, a logically fallacious test method by comparing an arrangement of the test blocks included in each respective one of the plurality of test methods with at least one dependency rule logically associated with at least one of the test blocks included in the respective test method; and discarding as logically fallacious, by the semiconductor platform test circuitry, each test method that violates the at least one dependency rule.

Example 3 may include elements of example 2 where validating each of the plurality of test methods, further may include, for each respective identified feature present in the semiconductor platform: detecting, by the semiconductor platform test circuitry, a duplicative test method by comparing the arrangement of the test blocks included in each respective one of the plurality of test methods with the test block arrangements in each remaining one of the plurality of test methods; and discarding as duplicative, by the semiconductor platform test circuitry, each duplicative test method that includes a test block arrangement identical to a remaining one of the plurality of test methods.

Example 4 may include elements of example 1 where retrieving, by the semiconductor platform test circuitry, one or more test blocks logically associated with the respective feature from the plurality of test blocks may include: retrieving, by the semiconductor platform test circuitry, from a data structure included in a communicably coupled storage device one or more test blocks logically associated with the respective feature from the plurality of test blocks.

Example 5 may include elements of example 1 where identifying, by semiconductor platform test circuitry, each of a number of features present in a semiconductor platform may include: autonomously identifying, by the semiconductor platform test circuitry, each of a number of features present in a semiconductor platform using one or more semiconductor platform identifiers disposed on the semiconductor platform.

Example 6 may include elements of example 1, and the method may additionally include: generating, by the semiconductor package test circuitry, at least one human perceptible output indicative of a PASS/FAIL result for each of the number of features included in the semiconductor platform.

Example 7 may include elements of example 1 where generating a plurality of test blocks may include, for each of the plurality of test blocks: receiving, by the semiconductor test platform circuitry, at least one input indicative of a test from a system user; autonomously parsing the received at least one input; and autonomously generating the test block, the generated test block including one or more machine-executable instruction sets that cause the semiconductor test platform circuitry to perform the test received from the system user.

Example 8 may include elements of any of examples 1 through 7 where generating a plurality of test blocks may include: training machine learning circuitry by providing a training set that includes a plurality of historical semiconductor platform feature test methods to the machine learning circuitry; autonomously identifying, by the machine learning circuitry, each of the test blocks included in the historical semiconductor platform feature test methods; and autonomously identifying, by the machine learning circuitry, at least one dependency rule for each of at least some of the plurality of identified test blocks.

Example 9 may include elements of example 8 where forming a logical association between each of the plurality of test blocks and each of at least one respective semiconductor platform feature may include: autonomously forming, by the machine learning circuitry, a logical association between each of the identified test blocks and the respective semiconductor platform feature test method.

According to example 10, there is provided a semiconductor platform test system. The system may include: at least one communications interface to exchange data with a communicably coupled semiconductor platform; processor circuitry communicably coupled to the communications interface; at least one storage device communicably coupled to the processor circuitry, the at least one storage device including instructions, that when executed by the processor circuitry, transform the processor circuitry to semiconductor test platform circuitry, the semiconductor test platform circuitry to: identify each of a number of features present in a semiconductor platform, for each respective identified feature present in the semiconductor platform: retrieve one or more test blocks logically associated with the respective feature from a plurality of test blocks; generate a plurality of test methods, each of the plurality of test methods including a respective permutation of the one or more retrieved test blocks; and validate each of the plurality of test methods; and perform each of the plurality of test methods on the semiconductor platform.

Example 11 may include elements of example 10 where the instructions that cause the semiconductor test platform circuitry to validate each of the plurality of test methods may further cause the semiconductor test platform circuitry to, for each respective identified feature present in the semiconductor platform: detect a logically fallacious test method by comparing an arrangement of the test blocks included in each respective one of the plurality of test methods with at least one dependency rule logically associated with at least one of the test blocks included in the respective test method; and discard as logically fallacious each test method that violates the at least one dependency rule.

Example 12 may include elements of example 11 where the instructions that cause the semiconductor test platform circuitry to validate each of the plurality of test methods may further cause the semiconductor test platform circuitry to, for each respective identified feature present in the semiconductor platform: detect a duplicative test method by comparing the arrangement of the test blocks included in each respective one of the plurality of test methods with the test block arrangements in each remaining one of the plurality of test methods; and discard as duplicative each duplicative test method that includes a test block arrangement identical to a remaining one of the plurality of test methods.

Example 13 may include elements of example 10 where the instructions that cause the semiconductor test platform circuitry to retrieve one or more test blocks logically associated with the respective feature from the plurality of test blocks may further cause the semiconductor test platform circuitry to: retrieve one or more test blocks logically associated with the respective feature from the plurality of test blocks from a data structure included in the at least one storage device.

Example 14 may include elements of example 10 where the instructions that cause the semiconductor test platform circuitry to identify each of a number of features present in a semiconductor platform may further cause the semiconductor test platform circuitry to: autonomously identify each of a number of features present in a semiconductor platform using one or more semiconductor platform identifiers disposed on the semiconductor platform.

Example 15 may include elements of example 10 where the instructions may further cause the semiconductor test platform circuitry to: generate at least one human perceptible output indicative of a PASS/FAIL result for each of the number of features included in the semiconductor platform.

Example 16 may include elements of example 10 where the one or more instruction sets may further cause the semiconductor test platform circuitry to, for each of the plurality of test blocks: receive at least one input indicative of a test from a system user; autonomously parse the received at least one input; and autonomously generate the test block, the generated test block including one or more machine-executable instruction sets that cause the semiconductor test platform circuitry to perform the test received from the system user.

Example 17 may include elements of any of examples 10 through 15, and the system may additionally include: machine learning circuitry communicably coupled to the processor circuitry, the machine learning circuitry to execute one or more instruction sets that cause the machine learning circuitry to: generate the plurality of test blocks, each of the plurality of test blocks logically associated with assessing an operability parameter of at least one semiconductor platform feature; and form a logical association between each of the plurality of test blocks and each of at least one respective semiconductor platform feature.

Example 18 may include elements of example 17 where the instruction sets that cause the machine learning circuit to generate a plurality of test blocks may further cause the machine learning circuit to: receive a training set that includes a plurality of historical semiconductor platform feature test methods to the machine learning circuitry; autonomously identify each of the test blocks included in the plurality of test blocks using a plurality of semiconductor platform feature test methods; and autonomously identify at least one dependency rule for each of at least some of the plurality of identified test blocks.

Example 19 may include elements of example 18 where the instruction sets that cause the machine learning circuit to form a logical association between each of the plurality of test blocks and each of at least one respective semiconductor platform feature may further cause the machine learning circuitry to: autonomously form a logical association between each of the identified test blocks and the respective semiconductor platform feature test method.

According to example 20, there is provided a semiconductor platform test system. The system may include: a means for generating a plurality of test blocks, each of the plurality of test blocks logically associated with assessing an operability parameter of at least one semiconductor platform feature; a means for forming a logical association between each of the plurality of test blocks and each of at least one respective semiconductor platform feature; a means for identifying each of a number of features present in a semiconductor platform; for each respective identified feature present in the semiconductor platform: a means for retrieving one or more test blocks logically associated with the respective feature from the plurality of test blocks; a means for generating a plurality of test methods, each of the plurality of test methods including a respective permutation of the one or more retrieved test blocks; and a means for validating each of the plurality of test methods; and a means for performing each of the plurality of test methods on the semiconductor platform.

Example 21 may include elements of example 20 where the means for validating each of the plurality of test methods may include, for each respective identified feature present in the semiconductor platform: a means for detecting an impermissible test method by comparing an arrangement of the test blocks included in each respective one of the plurality of test methods with at least one dependency rule logically associated with at least one of the test blocks included in the respective test method; and a means for discarding each test method that violates the at least one dependency rule as impermissible.

Example 22 may include elements of example 21 where the means for validating each of the plurality of test methods, may further comprise, for each respective identified feature present in the semiconductor platform: a means for detecting a duplicative test method by comparing the arrangement of the test blocks included in each respective one of the plurality of test methods with the test block arrangements in each remaining one of the plurality of test methods; and a means for discarding each test method that includes a test block arrangement identical to a remaining one of the plurality of test methods as duplicative.

Example 23 may include elements of example 20 where the means for retrieving one or more test blocks logically associated with the respective feature from the plurality of test blocks may include: a means for retrieving from a data structure included in a communicably coupled storage device one or more test blocks logically associated with the respective feature from the plurality of test blocks.

Example 24 may include elements of example 20 where the means for identifying each of a number of features present in a semiconductor platform may include: a means for autonomously identifying, by the semiconductor platform test circuitry, each of a number of features present in a semiconductor platform using one or more semiconductor platform identifiers disposed on the semiconductor platform.

Example 25 may include elements of example 20 and the system may additionally include: a means for generating at least one human perceptible output indicative of a PASS/FAIL result for each of the number of features included in the semiconductor platform.

Example 26 may include elements of example 20 where the means for generating a plurality of test blocks may include, for each of the plurality of test blocks: a means for receiving at least one input indicative of a test from a system user; a means for autonomously parsing the received at least one input; and a means for autonomously generating the test block.

Example 27 may include elements of any of examples 20 through 25 where the means for generating a plurality of test blocks may include: a means for providing a training set that includes a plurality of historical semiconductor platform feature test methods; a means for autonomously identifying each of the test blocks included in the plurality of test blocks using a plurality of semiconductor platform feature test methods; and a means for autonomously identifying, by the machine learning circuitry, at least one dependency rule for each of at least some of the plurality of identified test blocks.

Example 28 may include elements of example 27 where the means for forming a logical association between each of the plurality of test blocks and each of at least one respective semiconductor platform feature may include: a means for autonomously forming a logical association between each of the identified test blocks and the respective semiconductor platform feature test method.

According to example 29, there is provided a non-transitory processor-readable storage device including instructions, that when executed by the processor circuitry, transform the processor circuitry to semiconductor test platform circuitry, the semiconductor test platform circuitry to: identify each of a number of features present in a semiconductor platform; for each respective identified feature present in the semiconductor platform: retrieve one or more test blocks logically associated with the respective feature from a plurality of test blocks; generate a plurality of test methods, each of the plurality of test methods including a respective permutation of the one or more retrieved test blocks; and validate each of the plurality of test methods; and perform each of the plurality of test methods on the semiconductor platform.

Example 30 may include elements of example 29 where the instructions that cause the semiconductor test platform circuitry to validate each of the plurality of test methods may further cause the semiconductor test platform circuitry to, for each respective identified feature present in the semiconductor platform: detect an impermissible test method by comparing an arrangement of the test blocks included in each respective one of the plurality of test methods with at least one dependency rule logically associated with at least one of the test blocks included in the respective test method; and discard as impermissible each test method that violates the at least one dependency rule.

Example 31 may include elements of example 30 where the instructions that cause the semiconductor test platform circuitry to validate each of the plurality of test methods may further cause the semiconductor test platform circuitry to, for each respective identified feature present in the semiconductor platform: detect a duplicative test method by comparing the arrangement of the test blocks included in each respective one of the plurality of test methods with the test block arrangements in each remaining one of the plurality of test methods; and discard as duplicative each duplicative test method that includes a test block arrangement identical to a remaining one of the plurality of test methods.

Example 32 may include elements of example 29 where the instructions that cause the semiconductor test platform circuitry to retrieve one or more test blocks logically associated with the respective feature from the plurality of test blocks may further cause the semiconductor test platform circuitry to: retrieve one or more test blocks logically associated with the respective feature from the plurality of test blocks from a data structure included in the at least one storage device.

Example 33 may include elements of example 29 where the instructions that cause the semiconductor test platform circuitry to identify each of a number of features present in a semiconductor platform may further cause the semiconductor test platform circuitry to autonomously identify each of a number of features present in a semiconductor platform using one or more semiconductor platform identifiers disposed on the semiconductor platform.

Example 34 may include elements of example 29 where the instructions may further cause the semiconductor test platform circuitry to generate at least one human perceptible output indicative of a PASS/FAIL result for each of the number of features included in the semiconductor platform.

Example 35 may include elements of example 29 where the one or more instruction sets may further cause the semiconductor test platform circuitry to, for each of the plurality of test blocks: receive at least one input indicative of a test from a system user; autonomously parse the received at least one input; and autonomously generate the test block, the generated test block including one or more machine-executable instruction sets that cause the semiconductor test platform circuitry to perform the test received from the system user.

Example 36 may include elements of any of examples 29 through 34 where the instruction sets further cause at least a portion of the processor circuitry to transform to machine learning circuitry, the instruction sets may further cause the machine learning circuitry to generate the plurality of test blocks, each of the plurality of test blocks logically associated with assessing an operability parameter of at least one semiconductor platform feature; and form a logical association between each of the plurality of test blocks and each of at least one respective semiconductor platform feature.

Example 37 may include elements of example 36 where the instruction sets that cause the machine learning circuit to generate a plurality of test blocks may further cause the machine learning circuit to: receive a training set that includes a plurality of historical semiconductor platform feature test methods to the machine learning circuitry; autonomously identify each of the test blocks included in the plurality of test blocks using a plurality of semiconductor platform feature test methods; and autonomously identify at least one dependency rule for each of at least some of the plurality of identified test blocks.

Example 38 may include elements of example 37 where the instruction sets that cause the machine learning circuit to form a logical association between each of the plurality of test blocks and each of at least one respective semiconductor platform feature may further cause the machine learning circuitry to autonomously form a logical association between each of the identified test blocks and the respective semiconductor platform feature test method.

According to example 39, there is provided a system for autonomously generating test methods for semiconductor platform features, the system being arranged to perform the method of any of examples 1 through 9.

According to example 40, there is provided a chipset arranged to perform the method of any of examples 1 through 9.

According to example 41, there is provided a non-transitory machine readable medium comprising a plurality of instructions that, in response to be being executed on a computing device, cause the computing device to carry out the method according to any of examples 1 through 9.

According to example 42, there is provided a device configured for autonomously generating test methods for semiconductor platform features, the device being arranged to perform the method of any of the examples 1 through 9.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor platform test system, comprising:
a communications interface to exchange data with a communicatively coupled semiconductor platform;
processor circuitry communicatively coupled to the communications interface;
at least one storage device communicatively coupled to the processor circuitry, the at least one storage device including instructions that, when executed by the processor circuitry, transform the processor circuitry to semiconductor test platform circuitry and cause the semiconductor test platform circuitry to:
identify each of multiple features of the semiconductor platform, wherein to identify at least one feature of the multiple features includes to autonomously identify the at least one feature using one or more semiconductor platform identifiers disposed on the semiconductor platform;
for each respective identified feature of the semiconductor platform:
retrieve from a plurality of test blocks one or more test blocks logically associated with the identified feature;
generate one or more test methods, each generated test method including a respective permutation of the one or more retrieved test blocks; and
validate each of the one or more test methods generated for the identified feature; and
perform each of the generated test methods on the semiconductor platform;
wherein for each of at least one identified feature of the semiconductor platform, to validate each of the one or more generated test methods includes to detect an impermissible test method by:
comparing an arrangement of the test blocks included in each respective one of the one or more test methods generated for the respective identified feature with at least one dependency rule logically associated with at least one of the test blocks included in the respective test method; and
determining to discard as impermissible each generated test method that violates the at least one dependency rule.

2. The system of claim 1 wherein the instructions that cause the semiconductor test platform circuitry to retrieve one or more test blocks logically associated with the respective feature from the plurality of test blocks further cause the semiconductor test platform circuitry to:
retrieve one or more test blocks logically associated with the respective feature from the plurality of test blocks from a data structure included in the at least one storage device.

3. The system of claim 1 wherein the instructions further cause the semiconductor test platform circuitry to:
generate at least one human perceptible output indicative of a PASS/FAIL result for each of the number of features included in the semiconductor platform.

4. The system of claim 1 wherein the instructions further cause the semiconductor test platform circuitry to:
for at least one of the plurality of test blocks:

receive at least one input indicative of a test from a system user;
autonomously parse the received at least one input; and
autonomously generate the test block, the generated test block including one or more machine-executable instruction sets that cause the semiconductor test platform circuitry to perform the test received from the system user.

5. The system of claim 1, further comprising:
machine learning circuitry communicatively coupled to the processor circuitry, the machine learning circuitry to execute one or more instruction sets that cause the machine learning circuitry to:
generate the plurality of test blocks, each of the plurality of test blocks logically associated with assessing an operability parameter of at least one semiconductor platform feature; and
form a logical association between each of the plurality of test blocks and each of at least one respective semiconductor platform feature.

6. A semiconductor platform test system, comprising:
processor circuitry communicatively coupled to the communications interface;
at least one storage device communicatively coupled to the processor circuitry, the at least one storage device including instructions that, when executed by the processor circuitry, transform the processor circuitry to semiconductor test platform circuitry and cause the semiconductor test platform circuitry to:
identify each of multiple features of the semiconductor platform, wherein to identify at least one feature of the multiple features includes to autonomously identify the at least one feature using one or more semiconductor platform identifiers disposed on the semiconductor platform;
for each respective identified feature of the semiconductor platform:
retrieve from a plurality of test blocks one or more test blocks logically associated with the identified feature;
generate one or more test methods, each generated test method including a respective permutation of the one or more retrieved test blocks; and
validate each of the one or more test methods generated for the identified feature; and
perform each of the generated test methods on the semiconductor platform;
wherein for each of at least one identified feature of the semiconductor platform, to validate each of the one or more generated test methods includes to detect a duplicative test method by:
comparing an arrangement of the test blocks included in each respective one of the test methods generated for the respective identified feature with the test block arrangements in each other one of the plurality of test methods; and
determining to discard as duplicative each generated test method that includes a test block arrangement identical to one of the other generated test methods.

7. A semiconductor platform test system, comprising:
a communications interface to exchange data with a communicatively coupled semiconductor platform;
processor circuitry communicatively coupled to the communications interface;
machine learning circuitry communicatively coupled to the processor circuitry, the machine learning circuitry to execute one or more instruction sets that cause the machine learning circuitry to:
generate a plurality of test blocks, each of the plurality of test blocks logically associated with assessing an operability parameter of at least one semiconductor platform feature;
form a logical association between each of the plurality of test blocks and each of at least one respective semiconductor platform feature;
receive a training set that includes a plurality of historical semiconductor platform feature test methods to the machine learning circuitry;
autonomously identify each of the test blocks included in the plurality of test blocks using a plurality of semiconductor platform feature test methods; and
autonomously identify at least one dependency rule for each of at least some of the plurality of identified test blocks; and
at least one storage device communicatively coupled to the processor circuitry, the at least one storage device including instructions that, when executed by the processor circuitry, transform the processor circuitry to semiconductor test platform circuitry and cause the semiconductor test platform circuitry to:
identify each of multiple features of the semiconductor platform, wherein to identify at least one feature of the multiple features includes to autonomously identify the at least one feature using one or more semiconductor platform identifiers disposed on the semiconductor platform;
for each respective identified feature of the semiconductor platform:
retrieve from a plurality of test blocks one or more test blocks logically associated with the identified feature;
generate one or more test methods, each generated test method including a respective permutation of the one or more retrieved test blocks; and
validate each of the one or more test methods generated for the identified feature; and
perform each of the generated test methods on the semiconductor platform.

8. The system of claim 7 wherein the instruction sets that cause the machine learning circuit to form a logical association between each of the plurality of test blocks and each of at least one respective semiconductor platform feature further cause the machine learning circuitry to:
autonomously form a logical association between each of the identified test blocks and the respective semiconductor platform feature test method.

9. A semiconductor platform test method, comprising:
generating a plurality of test blocks, each of the plurality of test blocks logically associated with assessing an operability parameter of at least one semiconductor platform feature;
forming a logical association between each of the plurality of test blocks and each of at least one respective semiconductor platform feature;
identifying, by semiconductor platform test circuitry, each of a number of features included in a semiconductor platform;
for each respective identified feature included in the semiconductor platform:
retrieving, by the semiconductor platform test circuitry, one or more test blocks logically associated with the respective feature from the plurality of test blocks;
generating, by the semiconductor platform test circuitry, a plurality of test methods, each of the plurality of test methods including a respective permutation of the one or more retrieved test blocks; and
validating, by the semiconductor platform test circuitry, each of the plurality of test methods, wherein validating each of the plurality of test methods comprises detecting an impermissible test method by comparing an arrangement of the test blocks included in each respective one of the plurality of test methods with at least one dependency rule logically associated with at least one of the test blocks included in the respective test method, and by discarding as impermissible each test method that violates the at least one dependency rule; and
performing, by the semiconductor platform test circuitry, each of the plurality of test methods on the semiconductor platform.

10. The method of claim 9 wherein validating each of the plurality of test methods further comprises:
for each of at least one respective identified feature present in the semiconductor platform:
detecting, by the semiconductor platform test circuitry, a duplicative test method by comparing the arrangement of the test blocks included in each respective one of the plurality of test methods with the test block arrangements in each remaining one of the plurality of test methods; and
discarding as duplicative, by the semiconductor platform test circuitry, each duplicative test method that includes a test block arrangement identical to a remaining one of the plurality of test methods.

11. The method of claim 9 wherein retrieving, by the semiconductor platform test circuitry, one or more test blocks logically associated with the respective feature from the plurality of test blocks comprises:
retrieving, by the semiconductor platform test circuitry and from a data structure included in a communicatively coupled storage device, one or more test blocks logically associated with the respective feature from the plurality of test blocks.

12. The method of claim 9 wherein identifying each of a number of features present in a semiconductor platform comprises:
autonomously identifying, by the semiconductor platform test circuitry, each of a number of features present in a semiconductor platform using one or more semiconductor platform identifiers disposed on the semiconductor platform.

13. The method of claim 9, further comprising:
generating, by the semiconductor package test circuitry, at least one human perceptible output indicative of a PASS/FAIL result for each of the number of features included in the semiconductor platform.

14. The method of claim 9 wherein generating a plurality of test blocks comprises:
for each of the plurality of test blocks:
receiving, by the semiconductor test platform circuitry, at least one input indicative of a test from a system user;
autonomously parsing the received at least one input; and
autonomously generating the test block, the generated test block including one or more machine-executable instruction sets that cause the semiconductor test platform circuitry to perform the test received from the system user.

15. A semiconductor platform test method, comprising:
generating a plurality of test blocks, each of the plurality of test blocks logically associated with assessing an operability parameter of at least one semiconductor platform feature, the generating of the plurality of test blocks including:
training machine learning circuitry by providing a training set that includes a plurality of historical semiconductor platform feature test methods to the machine learning circuitry;
autonomously identifying, by the machine learning circuitry, each of the test blocks included in the historical semiconductor platform feature test methods; and
autonomously identifying, by the machine learning circuitry, at least one dependency rule for each of at least some of the plurality of identified test blocks;
forming a logical association between each of the plurality of test blocks and each of at least one respective semiconductor platform feature;
identifying, by semiconductor platform test circuitry, each of a number of features included in a semiconductor platform;
for each respective identified feature included in the semiconductor platform:
retrieving, by the semiconductor platform test circuitry, one or more test blocks logically associated with the respective feature from the plurality of test blocks;
generating, by the semiconductor platform test circuitry, a plurality of test methods, each of the plurality of test methods including a respective permutation of the one or more retrieved test blocks; and
validating, by the semiconductor platform test circuitry, each of the plurality of test methods; and
performing, by the semiconductor platform test circuitry, each of the plurality of test methods on the semiconductor platform.

16. The method of claim 15 wherein forming a logical association between each of the plurality of test blocks and each of at least one respective semiconductor platform feature comprises:
autonomously forming, by the machine learning circuitry, a logical association between each of the identified test blocks and the respective semiconductor platform feature test method.

17. A non-transitory processor-readable storage device including instructions that, when executed by processor circuitry, transform the processor circuitry to semiconductor test platform circuitry and cause the semiconductor test platform circuitry to:
identify each of multiple features of a semiconductor platform communicatively coupled to the semiconductor test platform circuitry, wherein to identify at least one feature of the multiple features includes to autonomously identify the at least one feature using one or more semiconductor platform identifiers disposed on the semiconductor platform;
for each respective identified feature of the semiconductor platform:
retrieve from a plurality of test blocks one or more test blocks logically associated with the identified feature;
generate one or more test methods, each generated test method including a respective permutation of the one or more retrieved test blocks; and
validate each of the one or more test methods generated for the identified feature; and
perform each of the generated test methods on the semiconductor platform;
wherein for each of at least one identified feature of the semiconductor platform, to validate each of the one or more generated test methods includes to detect an impermissible test method by comparing an arrangement of the test blocks included in each respective one of the one or more test methods generated for the respective identified feature with at least one dependency rule logically associated with at least one of the test blocks included in the respective test method, and by determining to discard as impermissible each generated test method that violates the at least one dependency rule.

18. The non-transitory processor-readable storage device of claim 17 wherein the instructions further cause the semiconductor test platform circuitry to:
generate at least one human perceptible output indicative of a PASS/FAIL result for each of the number of features included in the semiconductor platform.

19. A non-transitory processor-readable storage device including instructions that, when executed by processor circuitry, transform the processor circuitry to semiconductor test platform circuitry and cause the semiconductor test platform circuitry to:
identify each of multiple features of a semiconductor platform communicatively coupled to the semiconductor test platform circuitry, wherein to identify at least one feature of the multiple features includes to autonomously identify the at least one feature using one or more semiconductor platform identifiers disposed on the semiconductor platform;
for each respective identified feature of the semiconductor platform:
retrieve from a plurality of test blocks one or more test blocks logically associated with the identified feature;
generate one or more test methods, each generated test method including a respective permutation of the one or more retrieved test blocks; and
validate each of the one or more test methods generated for the identified feature; and
perform each of the generated test methods on the semiconductor platform;
wherein for each of at least one identified feature of the semiconductor platform, to validate each of the one or more generated test methods includes to detect a duplicative test method by:
comparing an arrangement of the test blocks included in each respective one of the test methods generated for the respective identified feature with the test block arrangements in each other one of the plurality of test methods; and
determining to discard as duplicative each generated test method that includes a test block arrangement identical to one of the other generated test methods.

20. The non-transitory processor-readable storage device of claim 17 wherein the instructions that cause the semiconductor test platform circuitry to retrieve one or more test blocks logically associated with the respective feature from the plurality of test blocks further cause the semiconductor test platform circuitry to:
retrieve one or more test blocks logically associated with the respective feature from the plurality of test blocks from a data structure included in the at least one storage device.

* * * * *